United States Patent
Chai et al.

(10) Patent No.: US 10,733,941 B2
(45) Date of Patent: Aug. 4, 2020

(54) PIXEL AND DISPLAY DEVICE HAVING THE SAME

(71) Applicants: Samsung Display Co., Ltd., Yongin-Si, Gyeonggi-Do (KR); Industry-University Cooperation Foundation Hanyang University, Seoul (KR)

(72) Inventors: Chongchul Chai, Seoul (KR); Ansu Lee, Seoul (KR); Boyong Chung, Suwon-si (KR); Oh-Kyong Kwon, Seoul (KR); Nack-Hyeon Keum, Daegu (KR)

(73) Assignees: SAMSUNG DISPLAY CO., LTD., Gyeonggi-do (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 94 days.

(21) Appl. No.: 16/166,475

(22) Filed: Oct. 22, 2018

(65) Prior Publication Data

US 2019/0164501 A1    May 30, 2019

(30) Foreign Application Priority Data

Nov. 29, 2017   (KR) .......................... 10-2017-0161821

(51) Int. Cl.
    *G09G 3/3291*     (2016.01)
    *G09G 3/3233*     (2016.01)
    (Continued)

(52) U.S. Cl.
    CPC ......... *G09G 3/3291* (2013.01); *G09G 3/3233* (2013.01); *G09G 3/3258* (2013.01);
    (Continued)

(58) Field of Classification Search
    CPC .. G09G 3/3291; G09G 3/3233; G09G 3/3241; G09G 3/3258; G09G 2300/0819;
    (Continued)

(56) References Cited

U.S. PATENT DOCUMENTS

| | | | | |
|---|---|---|---|---|
| 8,212,750 B2* | 7/2012 | Yamazaki | ............ | G09G 3/2022 345/76 |
| 2017/0178567 A1 | 6/2017 | Kang et al. | | |

FOREIGN PATENT DOCUMENTS

| | | |
|---|---|---|
| CN | 105096818 B | 11/2017 |
| EP | 1895498 A2 | 3/2008 |

(Continued)

OTHER PUBLICATIONS

Choi, et al., "A Self-compensated Voltage Programming Pixel Structure for Active-Matrix Organic Light Emitting Diodes", AMD/OELp-4, IDW 2003, pp. 535-538.

(Continued)

*Primary Examiner* — Priyank J Shah
(74) *Attorney, Agent, or Firm* — Cantor Colburn LLP

(57) ABSTRACT

A pixel includes a first transistor connected between a line supplying a power supply voltage and a second node, and providing a driving current corresponding to a data voltage to a light emitting element based on a voltage of a first node, a third transistor connected between the first node and a line supplying a reference voltage, and generating a sampling current based on a difference between a voltage of the second node and the reference voltage, a second transistor connected between the line supplying the power supply voltage and the first node, adjusting the voltage of the first node to generate the sampling current based on a voltage of a third node, a fourth transistor transferring the power supply voltage to the third node, a fifth transistor transferring the (Continued)

data voltage to the second node, and a capacitor connected between the first node and the third node.

24 Claims, 20 Drawing Sheets

(51) Int. Cl.
    *H01L 27/32*     (2006.01)
    *G09G 3/3258*     (2016.01)
    *G09G 3/3266*     (2016.01)

(52) U.S. Cl.
    CPC ....... *H01L 27/3276* (2013.01); *G09G 3/3266* (2013.01); *G09G 2300/0426* (2013.01); *G09G 2300/0439* (2013.01); *G09G 2300/0819* (2013.01); *G09G 2300/0842* (2013.01); *G09G 2310/0251* (2013.01); *G09G 2310/08* (2013.01); *G09G 2320/0233* (2013.01); *G09G 2320/0238* (2013.01); *G09G 2320/043* (2013.01)

(58) Field of Classification Search
    CPC ...... G09G 2320/043; G09G 2320/0233; H01L 27/32; H01L 27/3244
    See application file for complete search history.

(56) References Cited

FOREIGN PATENT DOCUMENTS

| KR | 1020070112714 A | 11/2007 |
| KR | 1020100035847 A | 4/2010 |

OTHER PUBLICATIONS

Extended European Search Report for Application No. 18209340.1 dated Jan. 18, 2019.

\* cited by examiner

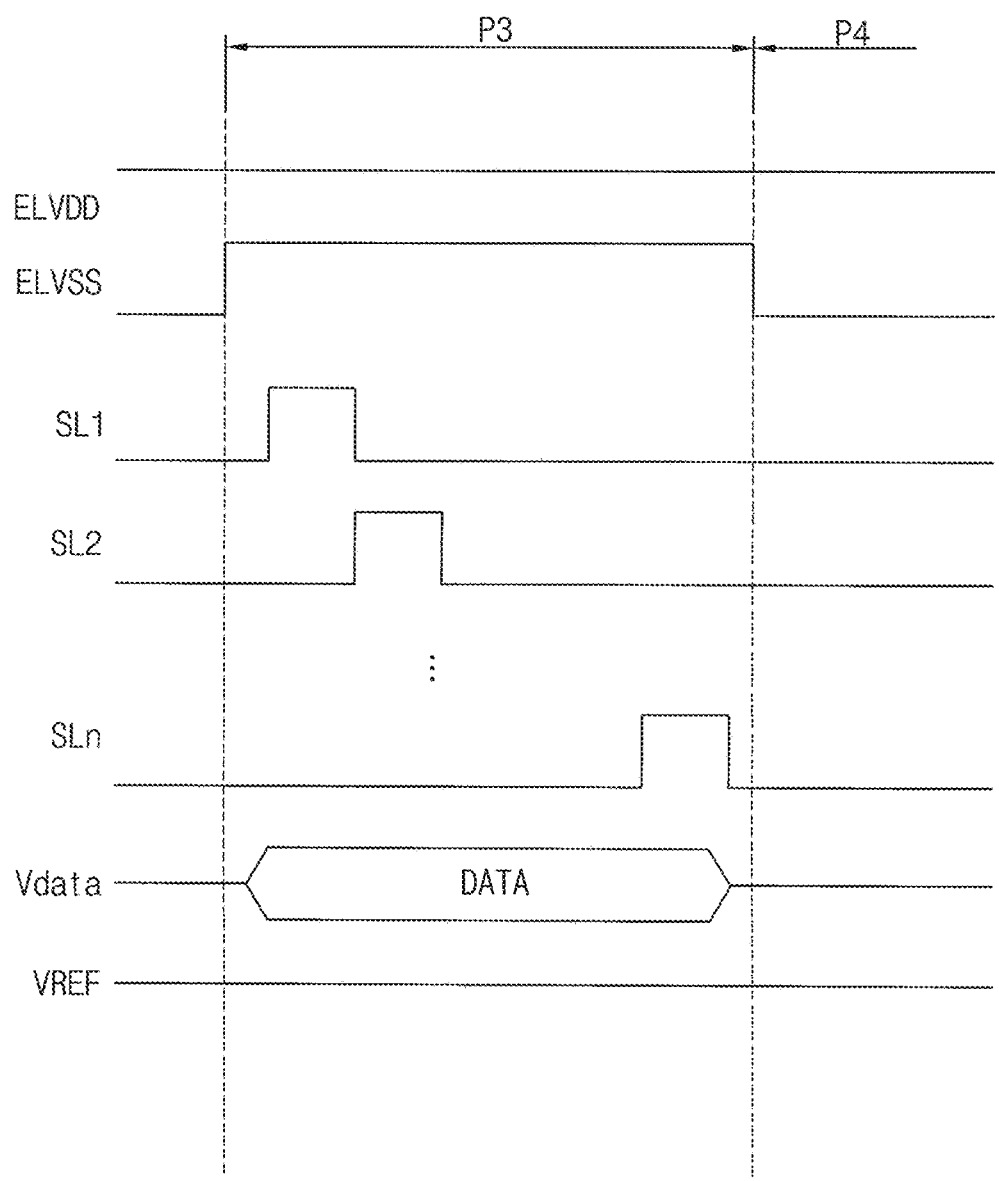

PIXEL AND DISPLAY DEVICE HAVING THE SAME

This application claims priority to Korean Patent Application No. 10-2017-0161821, filed on Nov. 29, 2017, and all the benefits accruing therefrom under 35 U.S.C. § 119, the content of which in its entirety is herein incorporated by reference.

BACKGROUND

1. Technical Field

Exemplary embodiments of the inventive concept relate to a display device, and more particularly to a pixel and a display device including the pixel.

2. Description of the Related Art

An organic light emitting display device includes a light emitting element, for example, an organic light emitting diode, the luminance of which varies according to a driving current. Each pixel may include the organic light emitting diode, a driving transistor that controls the amount of the driving current supplied to the organic light emitting diode according to a data voltage, and a switching transistor that applies the data voltage, for controlling a luminance of the organic light emitting diode, to the driving transistor.

Driving transistors may have different threshold voltages due to manufacturing errors, and thus, even when the same data voltage is applied, the amounts of driving currents output from the driving transistors may be different according to the different threshold voltages. Additionally, the amount of driving current to be output from a driving transistor during a current frame period may vary according to the amount of driving current output during a previous frame period. Furthermore, when an organic light emitting diode emits light during a previous frame period, the organic light emitting diode may slightly emit light during a current frame period even if a full black image is to be displayed.

As such, the pixel may further include a plurality of transistors in addition to the driving transistor and the switching transistor. For example, the pixel may further include a compensation transistor for compensating the threshold voltage of the driving transistor.

SUMMARY

As a resolution of the organic light emitting display device increases, and an efficiency of the organic light emitting diode is improved, the amount of driving current for driving one pixel may be decreased. However, when the pixel displays an image corresponding to a low gray level, the driving transistor may operate in a sub-threshold region, and an image quality may be degraded due to a sub-threshold slope deviation or a sub-threshold swing deviation.

Some exemplary embodiments provide a pixel capable of improving an image quality.

Some exemplary embodiments provide a display device including the pixel.

According to an exemplary embodiment, a pixel includes a first transistor including a gate connected to a first node, a first terminal which receives a first power supply voltage, and a second terminal connected to a second node, a second transistor including a gate connected to a third node, a first terminal which receives the first power supply voltage, and a second terminal connected to the first node, a third transistor including a gate connected to the second node, a first terminal connected to the first node, and a second terminal which receives a reference voltage, a fourth transistor including a gate which receives a first scan signal, a first terminal which receives the first power supply voltage, and a second terminal connected to the third node, a fifth transistor including a gate which receives the first scan signal, a first terminal which receives a data voltage, and a second terminal connected to the second node, a first capacitor connected between the first node and the third node, and a light emitting element including a first terminal connected to the second node and a second terminal which receives a second power supply voltage.

In an exemplary embodiment, the first transistor, the second transistor and the third transistor may operate in a saturation region.

In an exemplary embodiment, the reference voltage may be lower than the first power supply voltage and higher than the second power supply voltage.

In an exemplary embodiment, the pixel may further include a sixth transistor including a gate connected to the third node, a first terminal which receives the first power supply voltage, and a second terminal connected to the first terminal of the second transistor.

In an exemplary embodiment, the pixel may further include a seventh transistor including a gate which receives a bias voltage, a first terminal connected to the first node, and a second terminal connected to the first terminal of the third transistor.

In an exemplary embodiment, the pixel may further include an eighth transistor including a gate connected to the second terminal of the first transistor, a first terminal connected to the second terminal of the first transistor, and a second terminal connected to the second node.

In an exemplary embodiment, the pixel may further include a ninth transistor including a gate which receives a second scan signal, a first terminal connected to the first node, and a second terminal connected to the gate of the first transistor, and a tenth transistor including a gate which receives the second scan signal, a first terminal connected to the first node, and a second terminal connected to the first terminal of the third transistor.

In an exemplary embodiment, the pixel may further include a second capacitor connected between the gate of the first transistor and the second terminal of the first transistor.

In an exemplary embodiment, the pixel may further include a third capacitor connected between the gate of the first transistor and the first terminal of the first transistor.

In an exemplary embodiment, a period when the first scan signal has an on-level and a period when the second scan signal has an on-level may partially overlap each other.

In an exemplary embodiment, the reference voltage may be the same as the second power supply voltage.

In an exemplary embodiment, when the first scan signal has an on-level, the second power supply voltage may be higher than the data voltage.

According to an exemplary embodiment, a display device includes a display panel including a plurality of pixels, and a panel driver which drives the display panel. Each of the pixels includes a first transistor including a gate connected to a first node, a first terminal which receives a first power supply voltage, and a second terminal connected to a second node, a second transistor including a gate connected to a third node, a first terminal which receives the first power supply voltage, and a second terminal connected to the first node, a third transistor including a gate connected to the second node, a first terminal connected to the first node, and a second terminal which receives a reference voltage, a fourth transistor including a gate which receives a first scan signal, a first terminal which receives the first power supply voltage, and a second terminal connected to the third node, a fifth transistor including a gate which receives the first scan signal, a first terminal which receives a data voltage, and a second terminal connected to the second node, a first capacitor connected between the first node and the third node, and a light emitting element including a first terminal connected to the second node and a second terminal which receives a second power supply voltage.

In an exemplary embodiment, a frame period for the display panel may include a programming period in which the data voltage is applied to and maintained in the pixels and an emission period in which the pixels simultaneously emit light, and the second power supply voltage may have a first voltage level in the programming period and may have a second voltage level lower than the first voltage level in the emission period.

In an exemplary embodiment, the panel driver may drive the display panel such that the pixels sequentially emit light on a row-by-row basis, and the second power supply voltage may have a constant voltage level.

In an exemplary embodiment, the reference voltage may be lower than the first power supply voltage and higher than the second power supply voltage.

In an exemplary embodiment, the first transistor, the second transistor and the third transistor may operate in a saturation region.

In an exemplary embodiment, each of the pixels may further include a sixth transistor including a gate connected to the third node, a first terminal connected to the first power supply voltage, and a second terminal connected to the first terminal of the second transistor.

In an exemplary embodiment, each of the pixels may further include a seventh transistor including a gate which receives a bias voltage, a first terminal connected to the first node, and a second terminal connected to the first terminal of the third transistor.

In an exemplary embodiment, each of the pixels may further include an eighth transistor including a gate connected to the second terminal of the first transistor, a first terminal connected to the second terminal of the first transistor, and a second terminal connected to the second node.

In an exemplary embodiment, each of the pixels may further include a ninth transistor including a gate which receives a second scan signal, a first terminal connected to the first node, and a second terminal connected to the gate of the first transistor, and a tenth transistor including a gate which receives the second scan signal, a first terminal connected to the first node, and a second terminal connected to the first terminal of the third transistor.

In an exemplary embodiment, each of the pixels may further include a second capacitor connected between the gate of the first transistor and the second terminal of the first transistor.

In an exemplary embodiment, each of the pixels may further include a third capacitor connected between the gate of the first transistor and the first terminal of the first transistor.

According to an exemplary embodiment, a pixel includes a first transistor connected between a line supplying a power supply voltage and a second node, and which provides a driving current corresponding to a data voltage to a light emitting element based on a voltage of a first node, a third transistor connected between the first node and a line supplying a reference voltage, and which generates a sampling current based on a difference between a voltage of the second node and the reference voltage, a second transistor connected between the line supplying the power supply voltage and the first node, and which adjusts the voltage of the first node and generates the sampling current based on a voltage of a third node, a fourth transistor which transfers the power supply voltage to the third node in response to a scan signal, a fifth transistor which transfers the data voltage to the second node in response to the scan signal, and a capacitor connected between the first node and the third node.

As described above, the pixel according to an exemplary embodiment may form a negative feedback loop by connecting a gate and a source of a first transistor (or a driving transistor) to a drain and a gate of a third transistor (or another driving transistor), respectively. Accordingly, a voltage of an anode of an organic light emitting diode may be maintained as a data voltage, and an image quality degradation caused by a sub-threshold slope deviation or a sub-threshold swing deviation may be reduced.

The pixel may include n-channel metal oxide semiconductor ("NMOS") transistors, and thus may prevent an afterimage caused by hysteresis. The pixel may reduce power consumption by stopping a negative feedback operation while the pixel emits light. The pixel may further include a transistor that is connected in series with the driving transistors, thereby preventing degradation of the driving transistors.

The display device according to an exemplary embodiment may include the pixel, thereby improving the image quality.

BRIEF DESCRIPTION OF THE DRAWINGS

Illustrative, non-limiting exemplary embodiments will be more clearly understood from the following detailed description in conjunction with the accompanying drawings.

FIG. 5 is a timing diagram for describing another example of an operation of the pixel of FIG. 2.

DETAILED DESCRIPTION

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, exemplary embodiments of the inventive concept will be explained in detail with reference to the accompanying drawings.

Figure 1:
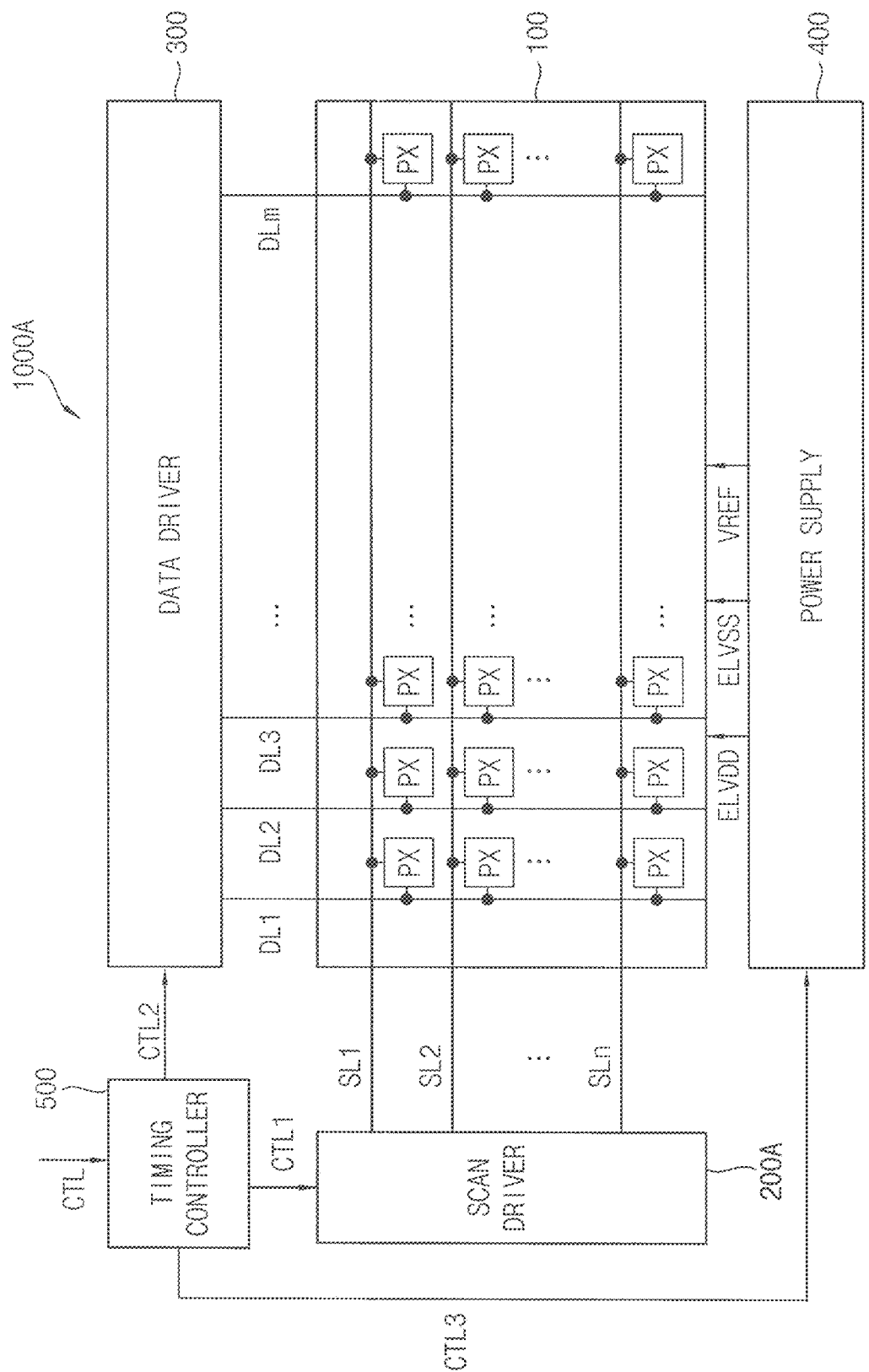
FIG. 1 is a block diagram illustrating an exemplary embodiment of a display device according to the invention.

FIG. 1 is a block diagram illustrating an exemplary embodiment of a display device according to the invention.

Referring to FIG. 1, a display device 1000A may include a display panel 100 having a plurality of pixels PX and a panel driver for driving the display panel 100. In some exemplary embodiments, the panel driver may include a scan driver 200A, a data driver 300, a power supply 400, and a timing controller 500. In some exemplary embodiments, the display device 1000A may be an organic light emitting display device.

The display panel 100 may include the plurality of pixel PX to display an image. In an exemplary embodiment, for example, the display panel 100 may include n*m pixels PX arranged in a matrix form of n rows of pixels and m columns of pixels, where n and m are integers greater than 1. The n*m pixels PX may be disposed at locations corresponding to crossing points of scan lines SL1 through SLn and data lines DL1 through DLm, respectively. Each pixel PX may include transistors that form a negative feedback loop, and thus may maintain a voltage of an anode of a light emitting element (e.g., an organic light emitting diode ("OLED")) as a data voltage in each frame period, which may be referred to as a negative feedback compensation operation. A configuration and an operation of the pixel PX will be described below with reference to FIGS. 2 through 8.

The scan driver 200A may provide a scan signal to the pixels PX via the scan lines SL1 through SLn based on a first control signal CTL1.

The data driver 300 may convert digital image data into analog type data voltages and may provide the data voltages to the pixels PX via the data lines DL1 through DLm based on a second control signal CTL2.

The power supply 400 may provide a first power supply voltage ELVDD, a second power supply voltage ELVSS, and a reference voltage VREF to the pixels PX based on a third control signal CTL3. In an exemplary embodiment, for example, the power supply 400 may include a DC-DC converter that generates output voltages having various voltage levels based on an input voltage (e.g., a battery voltage). The power supply 400 may further include switches that select output voltages based on the third control signal CTL3 to set voltage levels of the first power supply voltage ELVDD, the second power supply voltage ELVSS, and the reference voltage VREF.

The timing controller 500 may control the scan driver 200A, the data driver 300, and the power supply 400. In an exemplary embodiment, for example, the timing controller 500 may receive a control signal CTL from an external device (e.g., a system board). The timing controller 500 may generate the first through third control signals CTL1 through CTL3 to control the scan driver 200A, the data driver 300, and the power supply 400, respectively. The first control signal CTL1 for controlling the scan driver 200A may include a scan start signal, a scan clock signal, etc. The second control signal CTL2 for controlling the data driver 300 may include a horizontal start signal, a load signal, image data, etc. The third control signal CTL3 for controlling the power supply 400 may include a switch control signal for controlling the voltage level of the second power supply voltage ELVSS. The timing controller 500 may generate digital image data suitable for the operating conditions of the display panel 100 based on input image data and may provide the generated image data to the data driver 300.

As an efficiency of the light emitting element is improved, an amount of a driving current for driving one pixel may be decreased. In a case where the pixel displays an image corresponding to a low gray level, the driving transistor in the pixel may operate in a sub-threshold region, and an image quality may be degraded due to a sub-threshold slope deviation. However, the pixel PX of the display device 1000A according to the invention may include the negative feedback loop, and thus may prevent the image quality degradation caused by the sub-threshold slope deviation.

Figure 2:
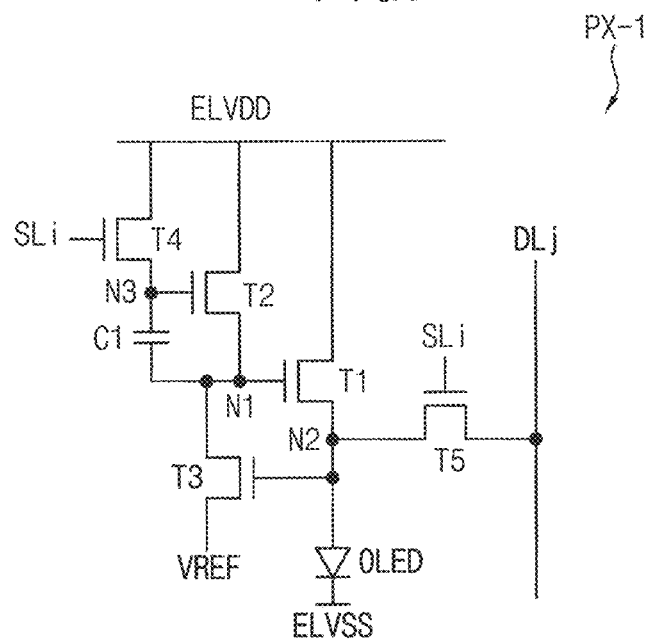
FIG. 2 is a circuit diagram illustrating an exemplary embodiment of a pixel included in the display device of FIG. 1.

FIG. 2 is a circuit diagram illustrating an exemplary embodiment of a pixel included in the display device of FIG. 1.

Referring to FIG. 2, a pixel PX-1 may include a first transistor T1, a second transistor T2, a third transistor T3, a fourth transistor T4, a fifth transistor T5, a first capacitor C1 and a light emitting element OLED. The pixel PX-1 may be located at an i-th row and a j-th column of the pixels PX, where i is an integer between 1 and n, and j is an integer between 1 and m. In some exemplary embodiments, the first transistor T1, the second transistor T2 and the third transistor T3 may operate in a saturation region. The first transistor T1, the second transistor T2 and the third transistor T3 may form a negative feedback loop, thereby constantly maintaining a voltage of a first terminal (or an anode) of the light emitting element OLED (i.e., a voltage of a second node N2).

The first transistor T1 may be connected between a line supplying the first power supply voltage ELVDD and a second node N2 and may provide a driving current corresponding to a data voltage to the light emitting element OLED based on a voltage of a first node N1. The first transistor T1 may include a gate connected to the first node N1, a first terminal connected to the line supplying the first power supply voltage ELVDD, and a second terminal connected to the second node N2. Here, a gate, source and drain mean a gate electrode, a source electrode and a drain electrode of the transistor, respectively, a first terminal is one of the source electrode and the drain electrode of the transistor, and a second terminal is the other of the source electrode and the drain electrode of the transistor.

The third transistor T3 may be connected between the first node N1 and a line supplying a reference voltage VREF and may generate a sampling current based on a difference between a voltage of the second node N2 and the reference voltage VREF. An amount of the sampling current may be determined according to a difference between a voltage of a gate of the third transistor T3 and a voltage of a second terminal (or a source electrode) of the third transistor T3. Thus, if the data voltage is applied to the gate (or the second node N2) of the third transistor T3, the amount of the sampling current may be determined based on the data voltage. The third transistor T3 may include the gate connected to the second node N2, a first terminal (or a drain electrode) connected to the first node N1, and the second terminal receiving the reference voltage VREF.

The second transistor T2 may be connected between the line supplying the first power supply voltage ELVDD and the first node N1 and may adjust the voltage of the first node N1 to generate the sampling current based on a voltage of a third node N3. Due to a current path through the second and third transistors T2 and T3, the sampling current flowing through the third transistor T3 may also flow through the second transistor T2, and a difference between a voltage of a gate of the second transistor T2 and a voltage of a second terminal (or a source electrode) of the second transistor T2 may be adjusted such that the sampling current flows through the second transistor T2. The second transistor T2 may include the gate connected to the third node N3, a first terminal (or a drain electrode) connected to the line supplying the first power supply voltage ELVDD, and the second terminal connected to the first node N1.

The first capacitor C1 may store the adjusted difference between the voltage of the gate of the second transistor T2 and the voltage of the source of the second transistor T2 (i.e., the voltage of the first node N1). The first capacitor C1 may include a first electrode connected to the first node N1 and a second electrode connected to the third node N3.

In response to a first scan signal received from an i-th scan line SLi, the fourth transistor T4 may transfer the first power supply voltage ELVDD to the third node N3 and may make the second transistor T2 to function as a diode. The fourth transistor T4 may include a gate receiving the first scan signal received from the i-th scan line SLi, a first terminal connected to the line supplying the first power supply voltage ELVDD, and a second terminal connected to the third node N3.

The fifth transistor T5 may transfer the data voltage received from the data line DLj to the second node N2 in response to the first scan signal received from the i-th scan line SLi. The fifth transistor T5 may include a gate receiving the first scan signal received from the i-th scan line SLi, a first terminal receiving the data voltage, and a second terminal connected to the second node N2.

The light emitting element OLED may include a first terminal (or an anode) connected to the second node N2 and a second terminal (or a cathode) connected to the line supplying the second power supply voltage ELVSS. In an exemplary embodiment, for example, the light emitting element OLED may be an organic light emitting diode.

In some exemplary embodiments, the first through fifth transistors T1 through T5 may be n-channel metal oxide semiconductor ("NMOS") transistors. In this case, since the NMOS transistor is less affected by hysteresis than a p-channel metal oxide semiconductor ("PMOS") transistor, a display device including the pixel PX-1 may effectively prevent an afterimage caused by the hysteresis.

Although FIG. 2 illustrates an example of the pixel PX-1 including five transistors T1 through T5, a configuration of the pixel PX-1 may not be limited thereto. In another exemplary embodiment, for example, the pixel PX-1 may further include an emission control transistor connected between the second terminal of the first transistor T1 and the first terminal of the light emitting element OLED to control the pixel PX-1 not to emit light while the data voltage is applied through the fifth transistor T5.

Figure 3:
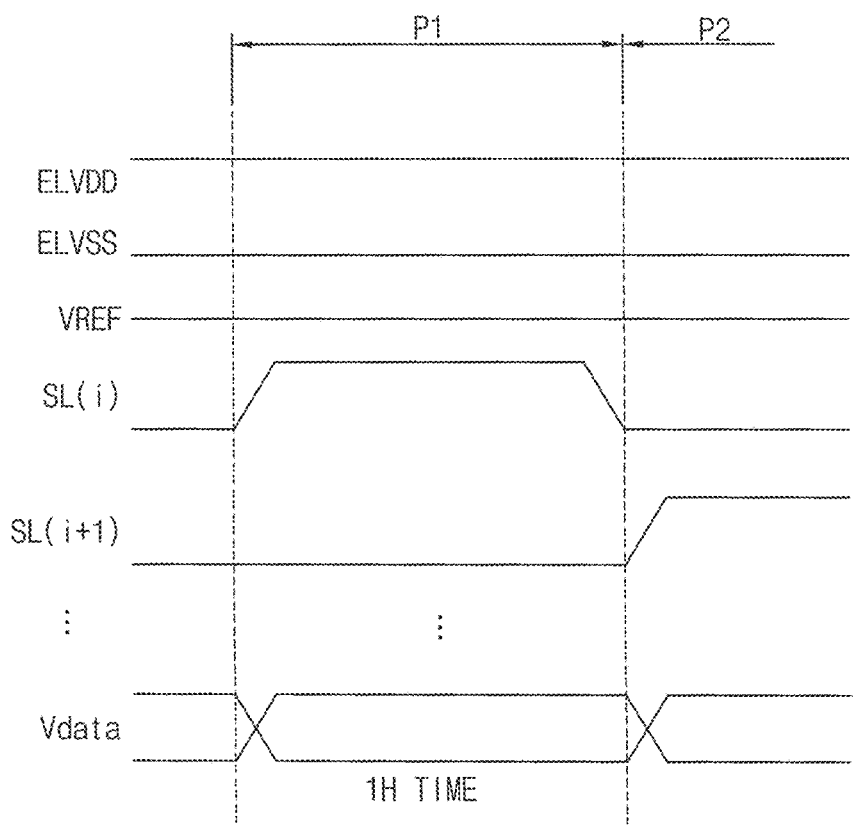
FIGS. 3, 4A and 4B are diagrams for describing an example of an operation of the pixel of FIG. 2.
Figure 4A:
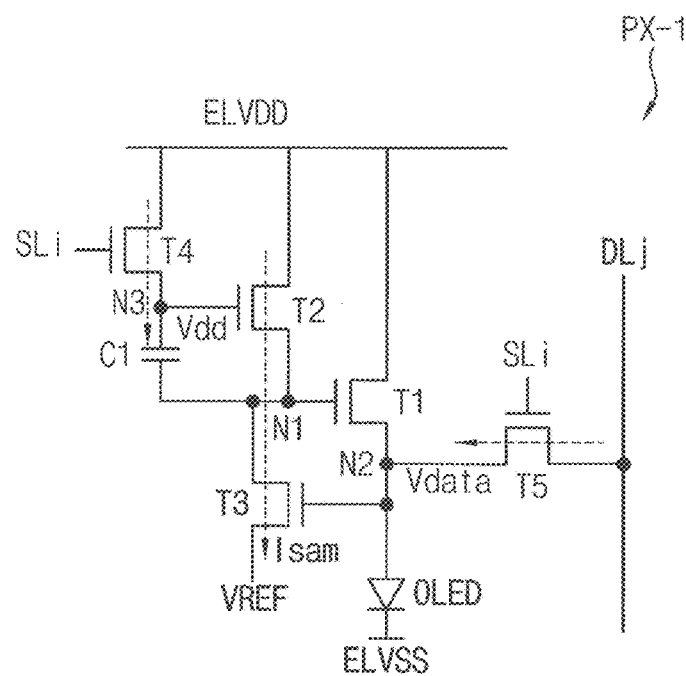
Figure 4B:
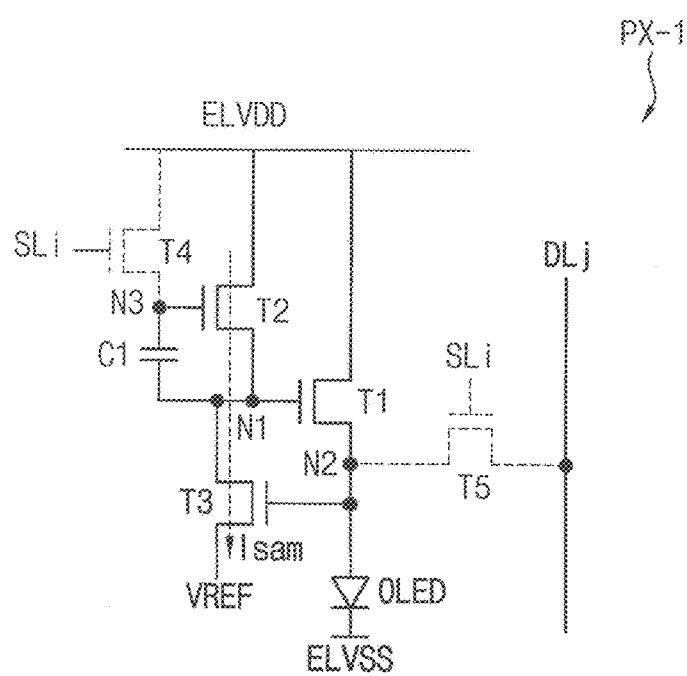

FIGS. 3, 4A and 4B are diagrams for describing an example of an operation of the pixel of FIG. 2.

Referring to FIGS. 3, 4A and 4B, a panel driver may drive a display panel in a progressive emission method where pixels sequentially emit light on a row-by-row basis. As illustrated in FIG. 3, the panel driver may sequentially provide a scan signal having an on-level to scan lines. A first power supply voltage ELVDD, a second power supply voltage ELVSS and a reference voltage VREF may be DC voltages. In some exemplary embodiments, the reference voltage VREF may be lower than the first power supply voltage ELVDD and higher than the second power supply voltage ELVSS. A voltage level of the reference voltage VREF may be set such that a sampling current is stably generated while power consumption is not greatly increased. In an exemplary embodiment, for example, the first power supply voltage ELVDD may be about 7V, the second power supply voltage ELVSS may be about 0V, and the reference voltage VREF may be about 4V.

In a first period P1, a pixel PX-1 located at an i-th row and a j-th column of the pixels PX may receive a scan signal SL(i) having an on-level. As illustrated in FIG. 4A, fourth and fifth transistors T4 and T5 of the pixel PX-1 may be turned on in response to the scan signal SL(i) having the on-level. The fifth transistor T5 may transfer a data voltage Vdata to a second node N2, and a voltage of the second node N2 may be set as the data voltage Vdata. The fourth transistor T4 may transfer the first power supply voltage ELVDD to a third node N3, and a voltage of the third node N3 may be set as the first power supply voltage ELVDD. A sampling current Isam corresponding to a difference (or Vdata-VREF) between a voltage (or Vdata) of a gate of a third transistor T3 and a voltage (or VREF) of a source of the third transistor T3 may flow through the third transistor T3. The sampling current Isam may flow also through a second transistor T2 included in a current path of the sampling current Isam. That is, a difference between a voltage of a gate of the second transistor T2 and a voltage of a source of the second transistor T2 may be adjusted such that the sampling current Isam flows through the second transistor T2, and the adjusted voltage difference may be stored in the first capacitor C1.

In a second period P2, the pixel PX-1 may receive the scan signal SL(i) having an off-level. As illustrated in FIG. 4B, the fourth and fifth transistors T4 and T5 of the pixel PX-1 may be turned off in response to the scan signal SL(i) having the off-level. In the second period P2, based on the voltage stored in the first capacitor C1, the sampling current Isam may flow through the second transistor T2 as it did in the first period P1. Further, the sampling current Isam may flow also through the third transistor T3. That is, the difference (or Vdata-VREF) between the voltage of the gate of the third transistor T3 and the voltage of the source of the third transistor T3 may be maintained such that the sampling current Isam flows through the third transistor T3 even in the second period P2. Thus, the pixel PX-1 may have a negative feedback loop structure including the first transistor T1, the second transistor T2 and the third transistor T3 operating in a saturation region, and thus may maintain a voltage of a first terminal (or the second node N2) of a light emitting element OLED as a constant voltage level. Accordingly, in the second period P2, a driving current corresponding to the voltage (or the data voltage Vdata) of the first terminal of the light emitting element OLED may flow through the light emitting element OLED, and the light emitting element OLED may emit light based on the driving current.

Further, since the pixel PX-1 has the negative feedback loop structure, the voltage of the first terminal of the light emitting element OLED may not be changed by an operating environment or an external factor. Here, the external factor may include a voltage variation according to degradation of a driving transistor or a light emitting element (a temporal factor), an effect, such as a coupling effect, caused by a voltage variation of an adjacent line (a spatial factor), etc.

According to an exemplary embodiment, in the case that a drivability of the light emitting element OLED is greater than a drivability of the first transistor T1, the voltage of the first terminal of the light emitting element OLED may be temporarily reduced. Accordingly, the difference between the voltage of the gate of the third transistor T3 and the voltage of the source of the third transistor T3 may be reduced, and thus an amount of the sampling current Isam flowing through the third transistor T3 may be reduced. Also, in the second transistor T2, the voltage of the source (or the first node N1) of the second transistor T2 may be increased such that the same reduced sampling current Isam flows through the second transistor T2. As the voltage of the first node N1 which is the gate of the first transistor T1 is increased, the driving current flowing through the first transistor T1 may be increased, and thus the voltage of the first terminal of the light emitting element OLED may be increased and return to the value before reducing.

In addition, in the case that the drivability of the light emitting element OLED is less than the drivability of the first transistor T1, the voltage of the first terminal of the light emitting element OLED may be temporarily increased. Accordingly, the difference between the voltage of the gate of the third transistor T3 and the voltage of the source of the third transistor T3 may be increased, and thus the amount of the sampling current Isam flowing through the third transistor T3 may be increased. Also, in the second transistor T2, the voltage of the source (or the first node N1) of the second transistor T2 may be decreased such that the same increased sampling current Isam flows through the second transistor T2. As the voltage of the first node N1 is decreased, the driving current flowing through the first transistor T1 may be decreased, and thus the voltage of the first terminal of the light emitting element OLED may be decreased and return to the value before increasing.

As described above, even if the voltage of the first terminal of the light emitting element OLED is changed according to the operating environment or the external factor, the sampling current Isam flowing through the second and third transistors T2 and T3 and the voltage of the first terminal of the light emitting element OLED may be maintained as constant.

FIG. 5 is a timing diagram for describing another example of an operation of the pixel of FIG. 2.

Referring to FIG. 5, a panel driver may drive a display panel in a simultaneous emission method where pixels simultaneously emit light. A frame period for the display panel may include a programming period in which data voltages are applied to and maintained in the pixels and an emission period in which the pixels simultaneously emit light.

In the programming period P3, the panel driver may sequentially provide a scan signal having an on-level to scan lines SL1 through SLn, and a second power supply voltage ELVSS may have a first voltage level such that light emitting elements do not emit light. For example, the first voltage level of the second power supply voltage ELVSS may be higher than the data voltage in the programming period P3. The pixel may provide the data voltage to the second node N2 of the pixel in response to the scan signal having the on-level, and a voltage of the first node N1 may be adjusted based on a sampling current Isam flowing through the second and third transistors T2 and T3. Since operations of the second and third transistors T2 and T3 in the programming period P3 are substantially the same as operations of the second and third transistors T2 and T3 in the first period P1 illustrated in FIG. 3, duplicated descriptions are omitted.

In the emission period P4, the second power supply voltage ELVSS may be changed to a second voltage level lower than the first voltage level such that the light emitting elements emit light. In the emission period P4, since the sampling current Isam which is the same as that in the programming period P3 flows, a voltage of the first terminal (or the second node N2) of the light emitting element OLED may be maintained as the data voltage, and the light emitting element OLED may emit light based on the data voltage. Since an operation of the pixel in the emission period P4 is substantially the same as an operation of a pixel in the second period P2 illustrated in FIG. 3, duplicated descriptions are omitted.

FIGS. 6A through 6G are circuit diagrams illustrating exemplary embodiments of pixels included in the display device of FIG. 1.

Referring to FIGS. 6A through 6G, a pixel PX-2 through PX-8 may further include at least one transistor connected in series with at least one of the driving transistors T1 through T5 to reduce a voltage difference between a drain and a source of the transistor connected to the additional transistor. Accordingly, a sampling current Isam may be stably generated, degradation of the driving transistors may effectively be prevented, and a leakage current may effectively be prevented.

Figure 6A:
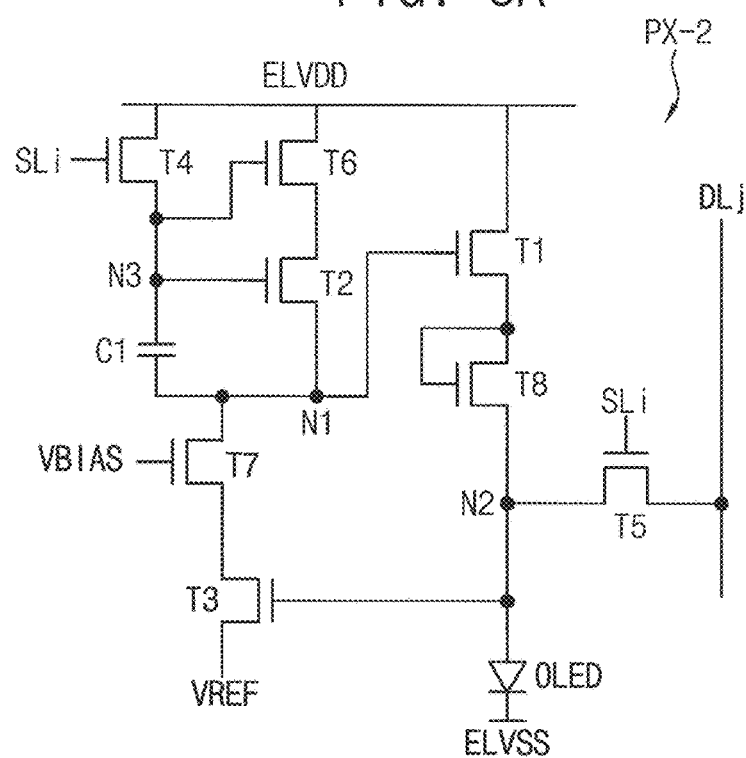
FIGS. 6A through 6G are circuit diagrams illustrating exemplary embodiments of pixels included in the display device of FIG. 1.
Figure 6B:
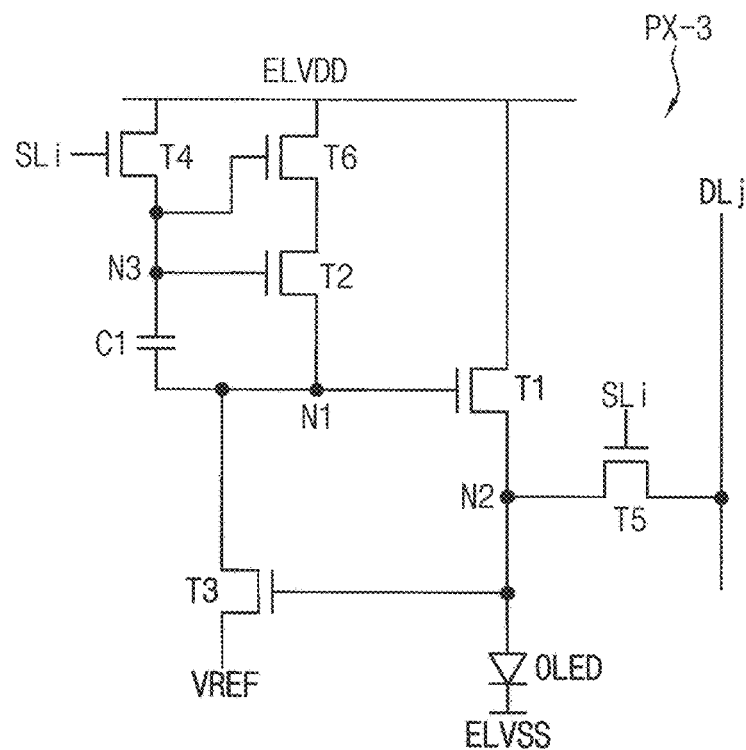
Figure 6C:
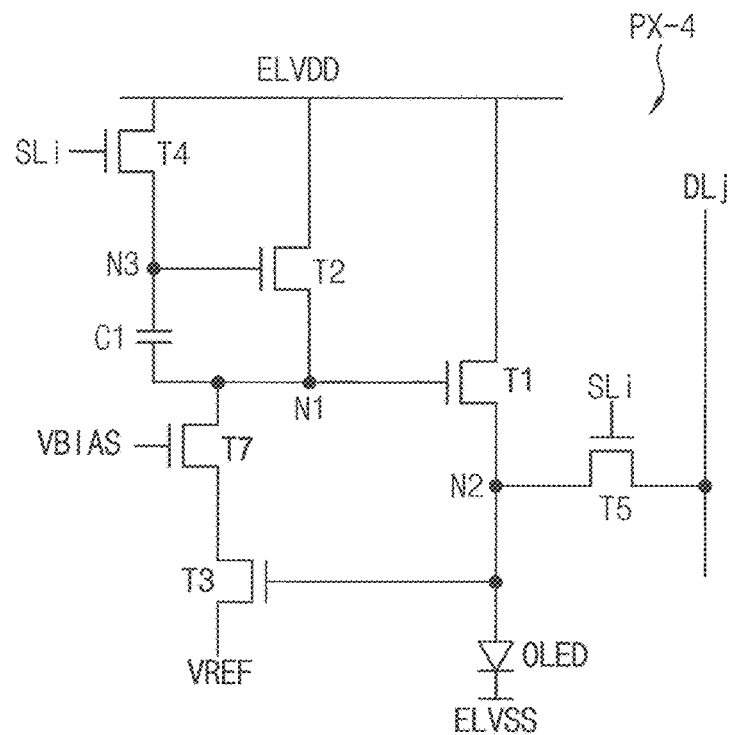
Figure 6D:
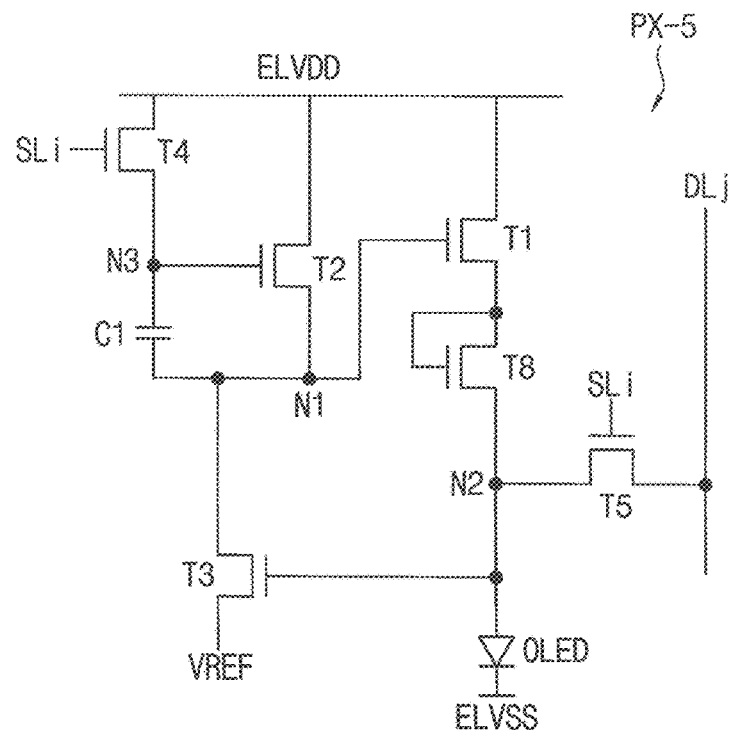
Figure 6E:
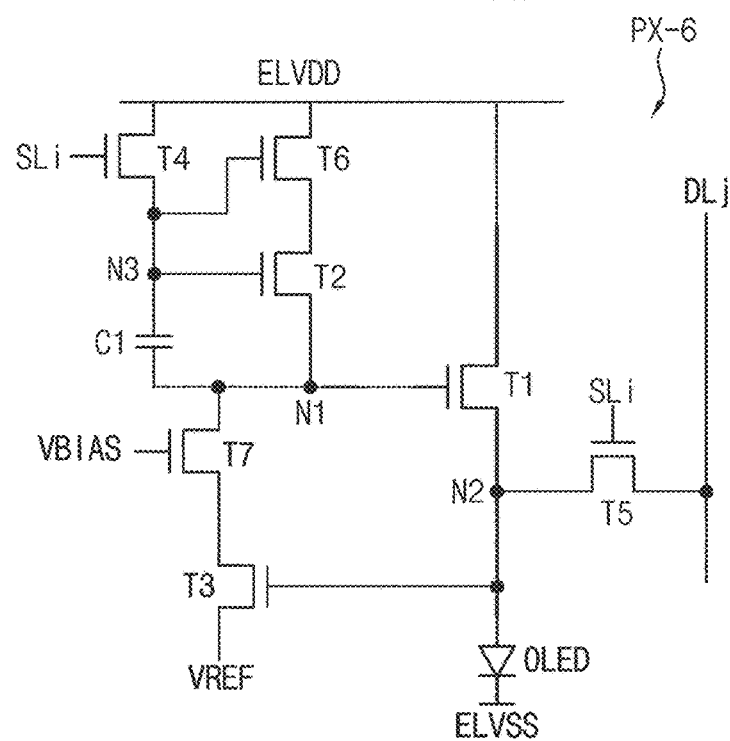
Figure 6F:
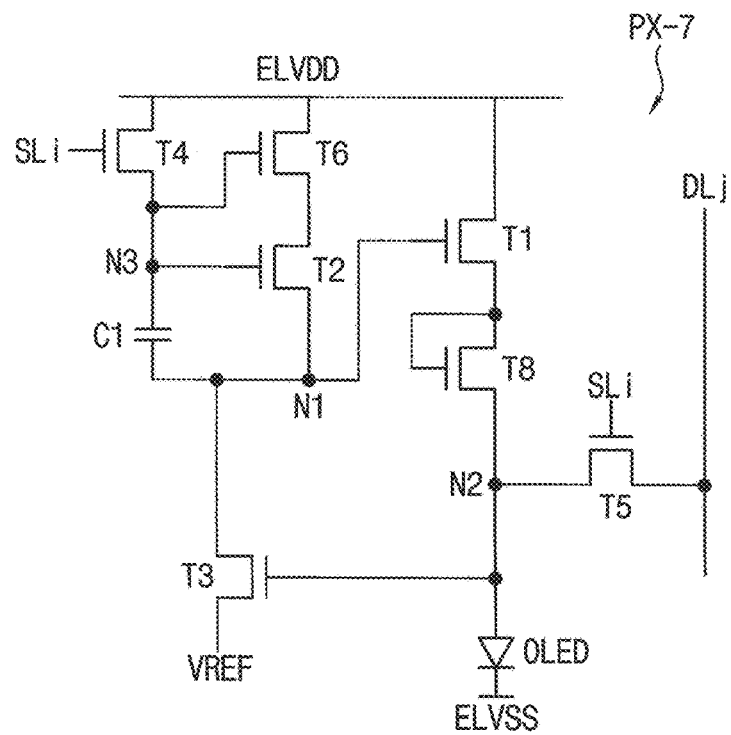
Figure 6G:
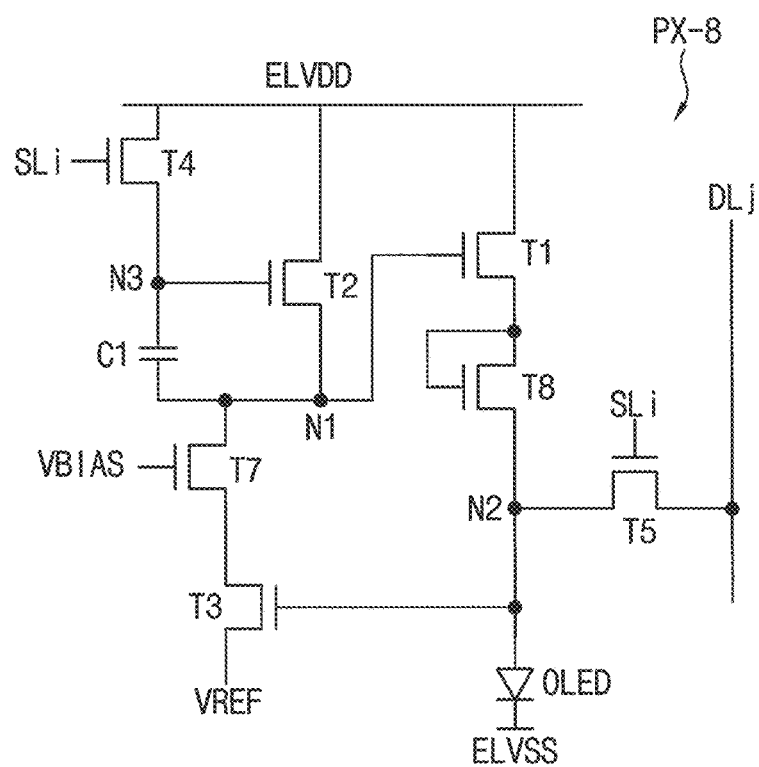

As illustrated in FIG. 6A, a pixel PX-2 may include a first transistor T1, a second transistor T2, a third transistor T3, a fourth transistor T4, a fifth transistor T5, a sixth transistor T6, a seventh transistor T7, an eighth transistor T8, a first capacitor C1 and a light emitting element OLED. The pixel PX-2 may be substantially the same as the pixel PX-1 of FIG. 2, except that the pixel PX-2 may further include the sixth through eighth transistors T6, T7 and T8. The same or similar reference numerals are used to indicate the same or similar elements, and duplicated descriptions are omitted.

The light emitting element OLED may include a first terminal (or an anode) connected to a second node N2 and a second terminal (or a cathode) connected to a second power supply voltage ELVSS.

The first transistor T1 may be connected between the line supplying a first power supply voltage ELVDD and the second node N2 and may provide a driving current corresponding to a data voltage to the light emitting element OLED based on a voltage of a first node N1.

The third transistor T3 may be connected between the first node N1 and the line supplying a reference voltage VREF and may generate a sampling current based on a difference between a voltage of the second node N2 and the reference voltage VREF.

The second transistor T2 may be connected between the line supplying the first power supply voltage ELVDD and the first node N1 and may adjust the voltage of the first node N1 to generate the sampling current based on a voltage of a third node N3.

The first capacitor C1 may be connected between the first node N1 and the third node N3.

The fourth transistor T4 may transfer the first power supply voltage ELVDD to the third node N3 in response to a first scan signal received from the i-th scan line SLi.

The fifth transistor T5 may transfer the data voltage to the second node N2 in response to the first scan signal received from the i-th scan line SLi.

The sixth transistor T6 may be connected between the second transistor T2 and the line supplying the first power supply voltage ELVDD and may reduce a voltage difference between the first terminal and the second terminal of the second transistor T2. In some exemplary embodiments, the sixth transistor T6 may include a gate connected to the third node N3, a first terminal connected to the line supplying the first power supply voltage ELVDD, and a second terminal connected to the first terminal of the second transistor T2.

The seventh transistor T7 may be connected between the third transistor T3 and the first node N1 and may reduce a voltage difference between the first terminal and the second terminal of the third transistor T3. In some exemplary embodiments, the seventh transistor T7 may include a gate receiving a bias voltage VBIAS, a first terminal connected to the first node N1, and a second terminal connected to the first terminal of the third transistor T3. Here, the bias voltage VBIAS may be a DC voltage that is set to turn on the seventh transistor T7.

The eighth transistor T8 may be connected between the first transistor T1 and the second node N2 and may reduce a current flowing through the first transistor T1 while the data voltage is applied to the second node N2. In some exemplary embodiments, the eighth transistor T8 may include a gate connected to the second terminal of the first transistor T1, a first terminal connected to the second terminal of the first transistor T1, and a second terminal connected to the second node N2.

As illustrated in FIGS. 6B through 6G, one or more of the sixth, seventh and eighth transistors T6, T7 and T8 may be added to the pixel PX-1 of FIG. 2, and thus various pixels PX-3, PX-4, PX-5, PX-6, PX-7 and PX-8 may be implemented.

Operations of the pixels PX-3, PX-4, PX-5, PX-6, PX-7 and PX-8 are substantially the same as an operation of the pixel PX-1 of FIG. 2, and thus duplicated descriptions are omitted.

FIGS. 7A, 7B, 8A, 8B, 9A and 9B are diagrams for describing an effect of the pixel of FIG. 6A.

Referring to FIGS. 7A, 7B, 8A, 8B, 9A and 9B, in a display device including a pixel having a circuit structure illustrated in FIG. 6A, a current error according to a threshold voltage deviation or a sub-threshold slope deviation (or a sub-threshold swing deviation) has been measured.

Figure 7A:
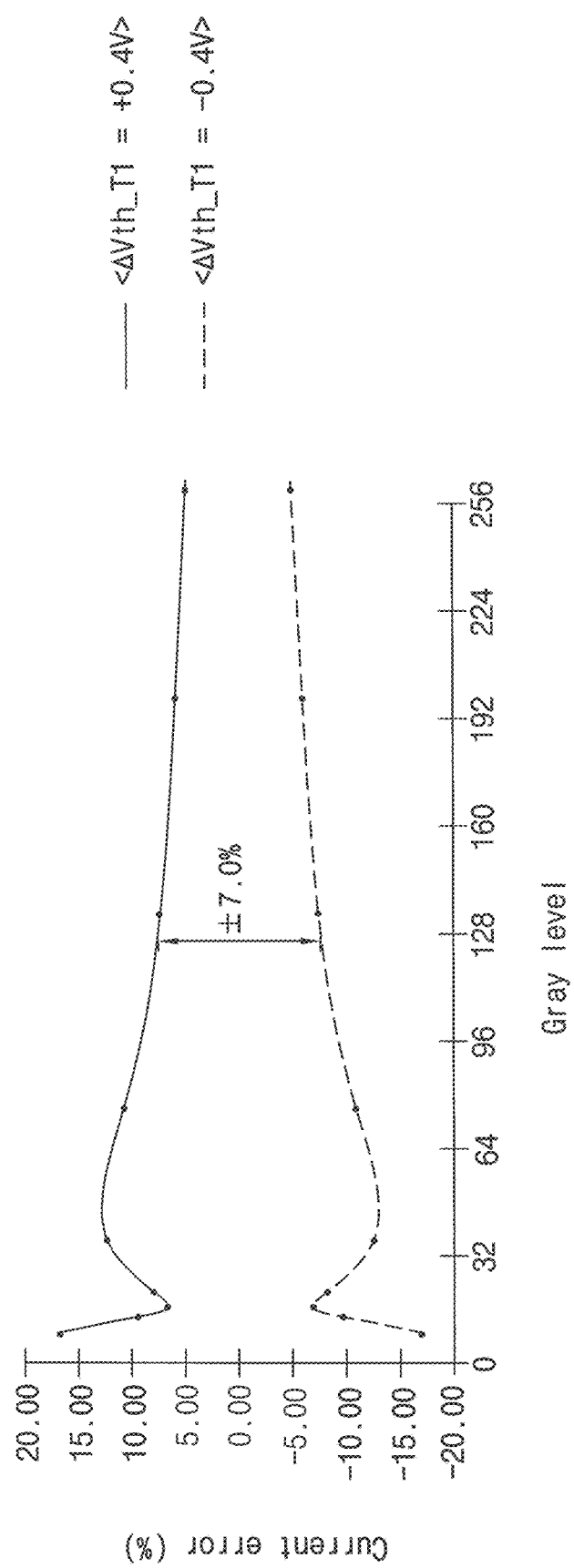
FIGS. 7A, 7B, 8A, 8B, 9A and 9B are diagrams for describing an effect of the pixel of FIG. 6A.

As illustrated in FIG. 7A, the first transistor T1 included in the pixel may have a threshold voltage deviation $\Delta Vth\_T1$. If the first transistor T1 has a threshold voltage which is about 0.4V higher than a reference value (i.e., $\Delta Vth\_T1=+0.4V$), a current error of about +7% has been measured at a 128-gray level. Further, if a first transistor T1 has a threshold voltage which is about 0.4V lower than a reference value (i.e., $\Delta Vth\_T1=-0.4V$), a current error of about −7% has been measured at a 128-gray level.

Figure 7B:
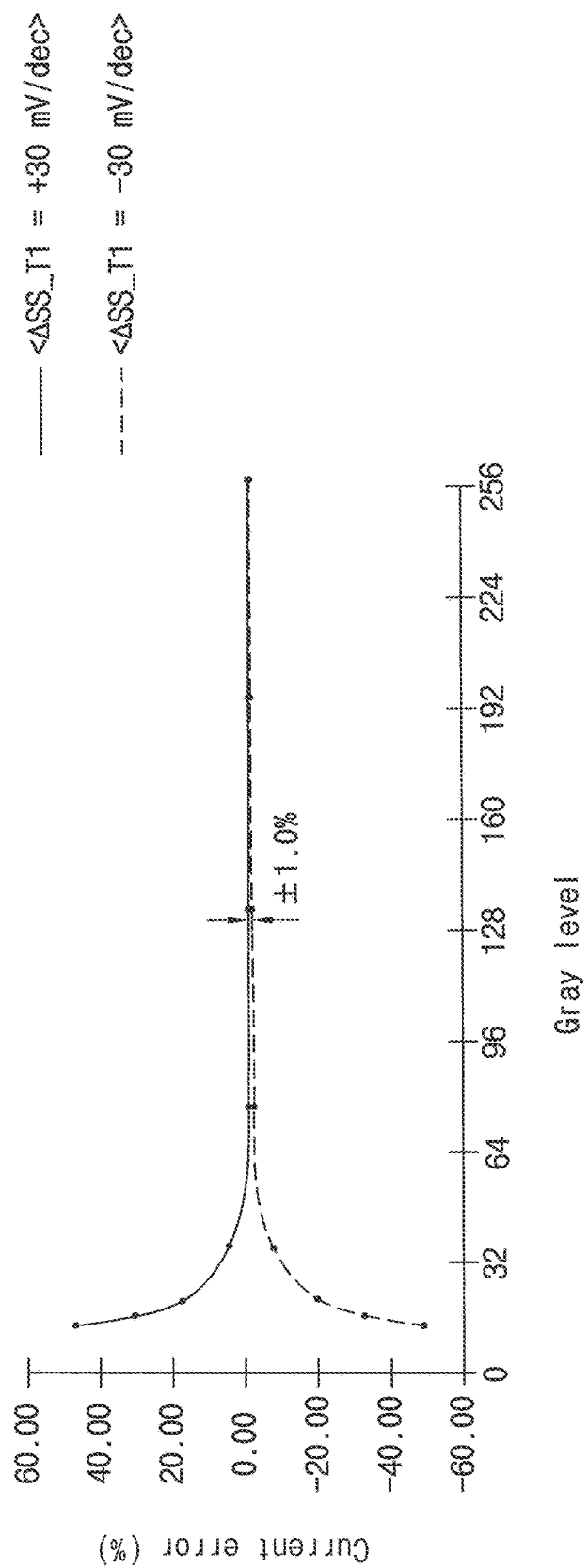

As illustrated in FIG. 7B, the first transistor T1 included in the pixel may have a sub-threshold slope deviation $\Delta SS\_T1$. If the first transistor T1 has a sub-threshold slope which is 30 mV/dec higher than a reference value (i.e., $\Delta SS\_T1=+30$ mV/dec), a current error of about +1% has been measured at a 128-gray level. Further, if the first transistor T1 has a sub-threshold slope which is about 30 mV/dec lower than a reference value (i.e., $\Delta SS\_T1=-30$ mV/dec), a current error of about −1% has been measured at a 128-gray level.

Figure 8A:
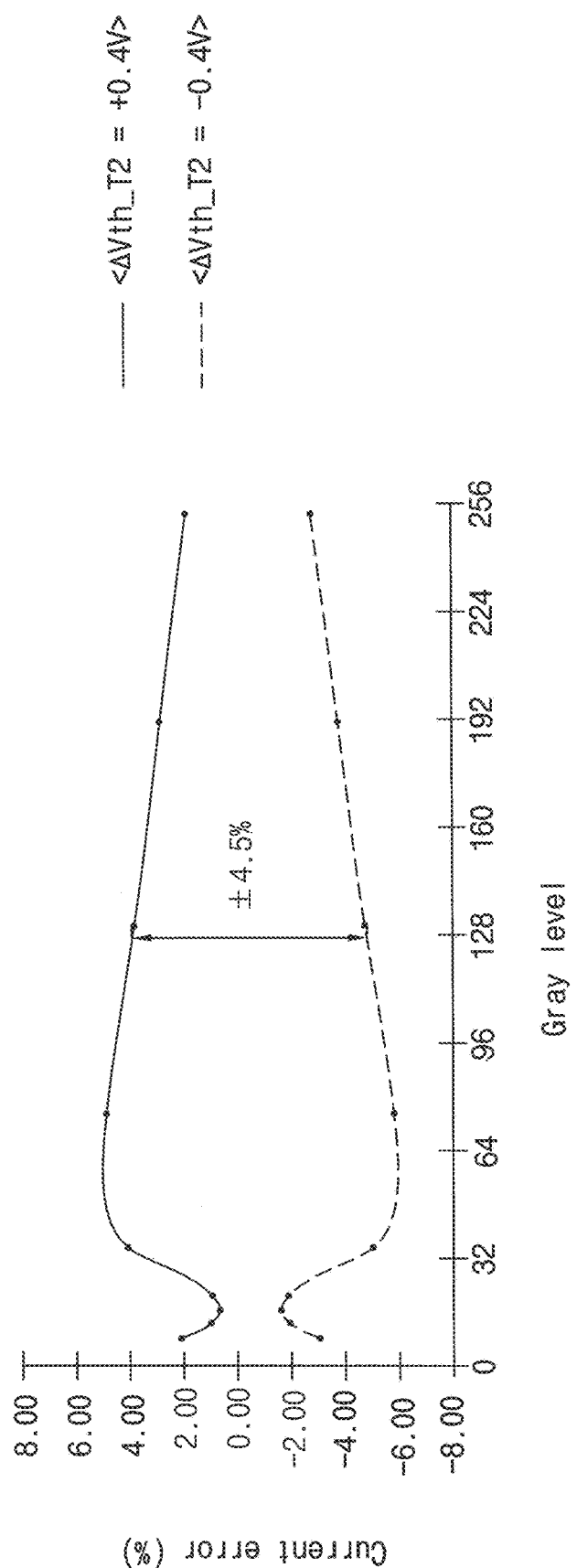

As illustrated in FIG. 8A, the second transistor T2 included in the pixel may have a threshold voltage deviation $\Delta Vth\_T2$. If the second transistor T2 has a threshold voltage which is about 0.4V higher than a reference value (i.e., $\Delta Vth\_T2=+0.4V$), a current error of about +4.5% has been measured at a 128-gray level. Further, if the second transistor T2 has a threshold voltage which is about 0.4V lower than a reference value (i.e., $\Delta Vth\_T2=-0.4V$), a current error of about −4.5% has been measured at a 128-gray level.

Figure 8B:
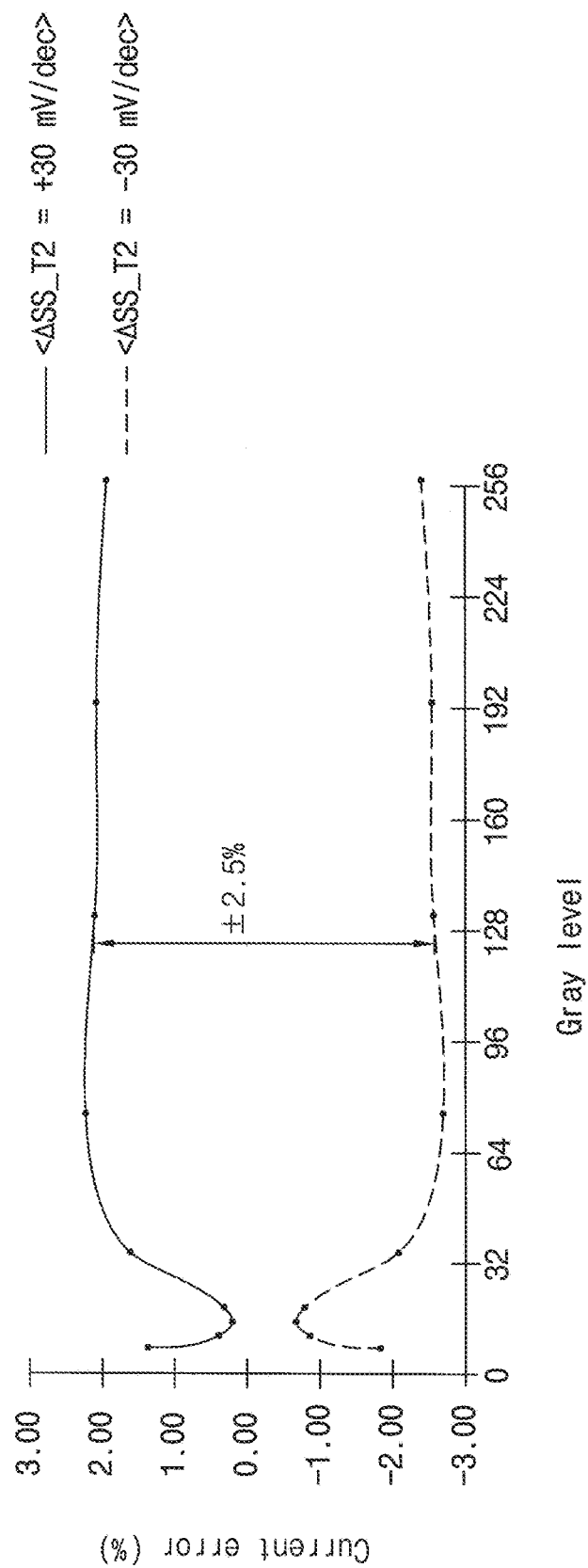

As illustrated in FIG. 8B, the second transistor included in the pixel may have a sub-threshold slope deviation $\Delta SS\_T2$. If the second transistor T2 has a sub-threshold slope which is about 30 mV/dec higher than a reference value (i.e., $\Delta SS\_T2=+30$ mV/dec), a current error of about +2.5% has been measured at a 128-gray level. Further, if the second transistor T2 has a sub-threshold slope which is about 30 mV/dec lower than a reference value (i.e., $\Delta SS\_T2=-30$ mV/dec), a current error of about −2.5% has been measured at a 128-gray level.

Figure 9A:
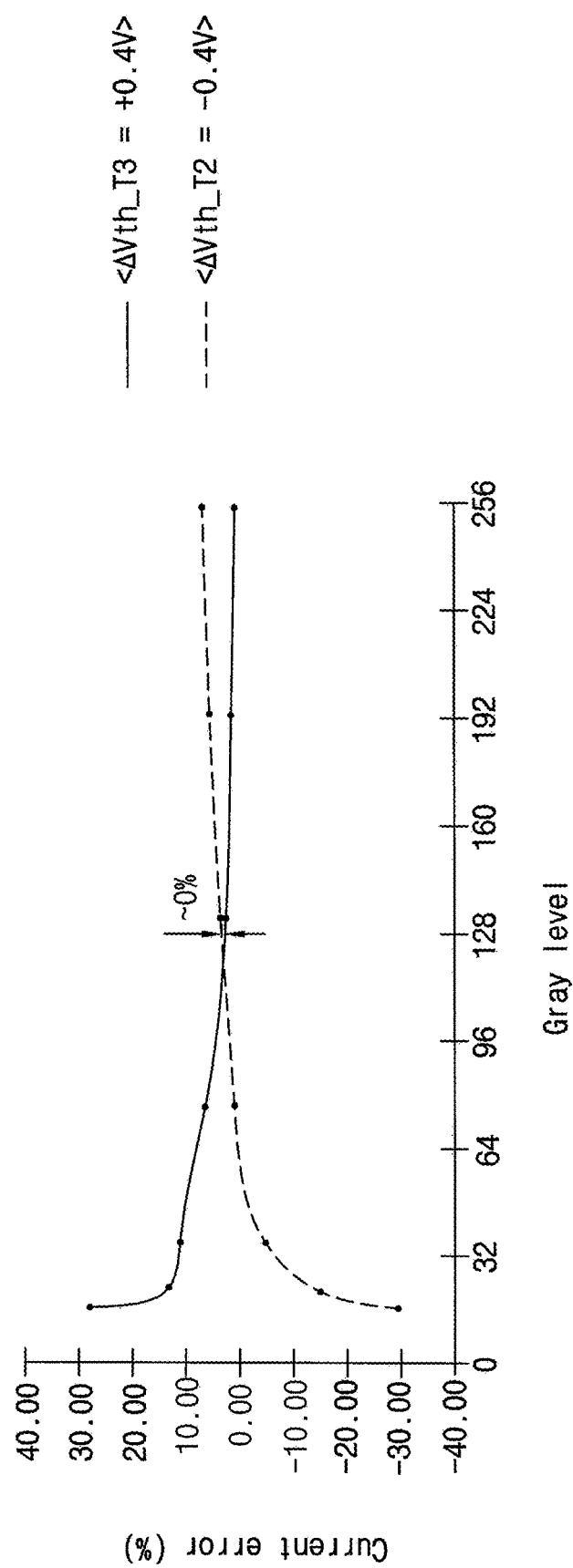

As illustrated in FIG. 9A, the third transistor T3 included in the pixel may have a threshold voltage deviation $\Delta Vth\_T3$. If the third transistor T3 has a threshold voltage which is about 0.4V higher than a reference value (i.e., $\Delta Vth\_T3=+0.4V$), a current error of about +0% has been measured at a 128-gray level. Further, if the third transistor has a threshold voltage which is about 0.4V lower than a reference value (i.e., $\Delta Vth\_T3=-0.4V$), a current error of about 0% has been measured at a 128-gray level.

Figure 9B:
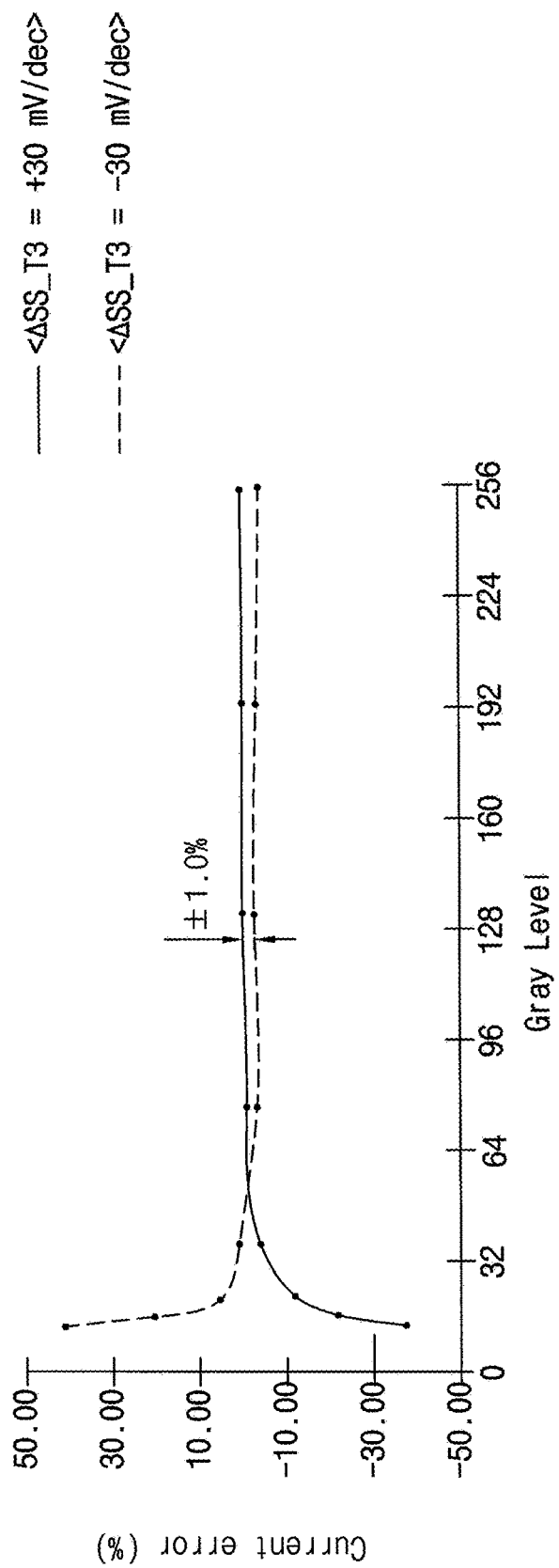

As illustrated in FIG. 9B, the third transistor included in the pixel may have a sub-threshold slope deviation $\Delta SS\_T3$. If the third transistor T3 has a sub-threshold slope which is about 30 mV/dec higher than a reference value (i.e., $\Delta SS\_T3=+30$ mV/dec), a current error of about +1.0% has been measured at a 128-gray level. Further, if the third transistor T3 has a sub-threshold slope which is about 30 mV/dec lower than a reference value (i.e., $\Delta SS\_T3=-30$ mV/dec), a current error of about −1.0% has been measured at a 128-gray level.

In conclusion, even if the first through third transistors T1 through T3 have the threshold voltage deviations $\Delta Vth\_T1$, $\Delta Vth\_T2$ and $\Delta Vth\_T3$ and the sub-threshold slope deviations $\Delta SS\_T1$, $\Delta SS\_T2$ and $\Delta SS\_T3$, the current error may be relatively small compared with that of a conventional display device. In particular, the current error caused by the sub-threshold slope deviation has been greatly reduced compared with that of a conventional display device. In a conventional display device, the current error caused by the sub-threshold slope deviation of about 30 mV/dec is about 38%. However, in the display device according to exemplary embodiments, the current error caused by the sub-threshold slope deviation of about 30 mV/dec may be about 4.5%.

Accordingly, the pixel according to exemplary embodiments including a negative feedback loop may reduce an image degradation caused by the sub-threshold slope deviation.

Figure 10:
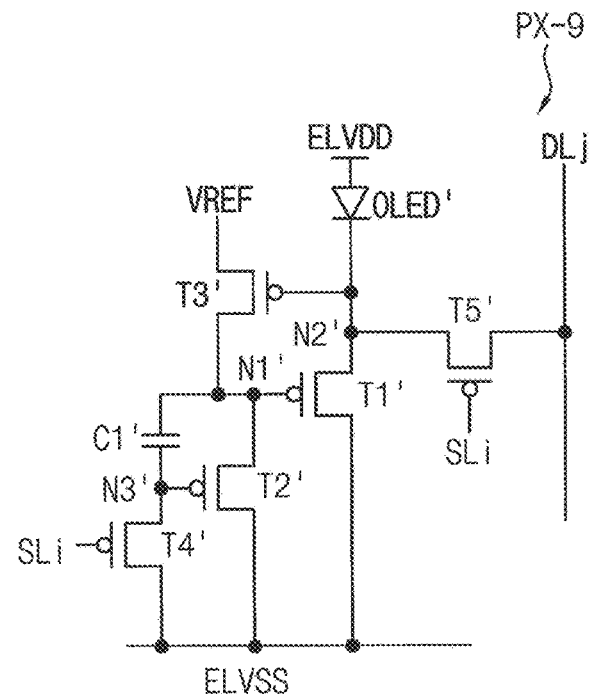
FIG. 10 is a circuit diagram illustrating another exemplary embodiment of a pixel included in the display device of FIG. 1.

FIG. 10 is a circuit diagram illustrating another exemplary embodiment of a pixel included in the display device of FIG. 1.

Referring to FIG. 10, a pixel PX-9 may include a first transistor T1', a second transistor T2', a third transistor T3', a fourth transistor T4', a fifth transistor T5', a first capacitor C1' and a light emitting element OLED'. A structure of the pixel PX-9 may be substantially the same as the pixel PX-1 of FIG. 2, except that the first through fifth transistors T1' through T5' are PMOS transistors. The same or similar reference numerals are used to indicate the same or similar elements, and duplicated descriptions are omitted.

The light emitting element OLED' may include a first terminal (or a cathode) connected to a second node N2' and a second terminal (or an anode) connected to a first power supply voltage ELVDD.

The first transistor T1' may be connected between the line supplying a second power supply voltage ELVSS and the second node N2' and may provide a driving current corresponding to a data voltage to the light emitting element OLED' based on a voltage of a first node N1'.

The third transistor T3' may be connected between the first node N1' and the line supplying a reference voltage VREF and may generate a sampling current based on a difference between a voltage of the second node N2' and the reference voltage VREF.

The second transistor T2' may be connected between the line supplying the second power supply voltage ELVSS and the first node N1' and may adjust the voltage of the first node N1' to generate the sampling current based on a voltage of a third node N3'.

The first capacitor C1' may be connected between the first node N1' and the third node N3'.

The fourth transistor T4' may transfer the second power supply voltage ELVSS to the third node N3' in response to a first scan signal received from the i-th scan line SLi.

The fifth transistor T5' may transfer the data voltage to the second node N2' in response to the first scan signal received from the i-th scan line SLi.

An operation of the pixel PX-9 may be substantially the same as an operation of the pixel PX-1 of FIG. 2, and thus duplicated descriptions are omitted.

Figure 11:
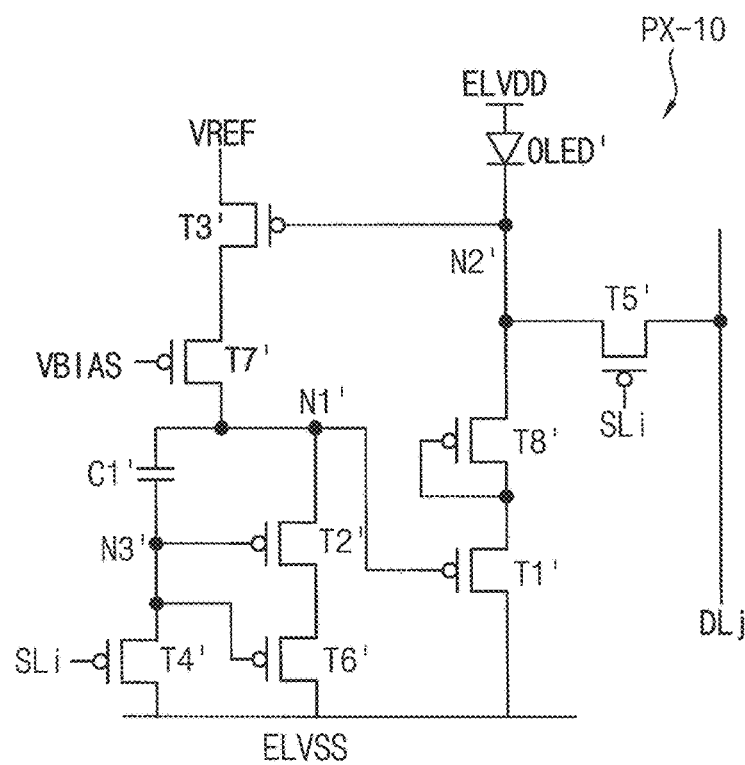
FIG. 11 is a circuit diagram illustrating still another exemplary embodiment of a pixel included in the display device of FIG. 1.

FIG. 11 is a circuit diagram illustrating still another exemplary embodiment of a pixel included in the display device of FIG. 1.

Referring to FIG. 11, a pixel PX-10 may include a first transistor T1', a second transistor T2', a third transistor T3', a fourth transistor T4', a fifth transistor T5', a sixth transistor T6', a seventh transistor T7', an eighth transistor T8', a first capacitor C1' and a light emitting element OLED'. The pixel PX-10 may be substantially the same as the pixel PX-9 of FIG. 10, except that the pixel PX-10 may further include the sixth through eighth transistors T6', T7' and T8'. In addition, A structure of the pixel PX-10 may be substantially the same as the pixel PX-2 of FIG. 6A, except that the first through eighth transistors T1' through T8' are PMOS transistors. The same or similar reference numerals are used to indicate the same or similar elements, and duplicated descriptions are omitted.

The sixth transistor T6' may be connected between the second transistor T2' and a line supplying a second power supply voltage ELVSS and may reduce a voltage difference between a first terminal and a second terminal of the second transistor T2'. In some exemplary embodiments, the sixth transistor T6' may include a gate connected to a third node N3', a first terminal connected to the line supplying the second power supply voltage ELVSS, and a second terminal connected to a first terminal of the second transistor T2'.

The seventh transistor T7' may be connected between the third transistor T3' and a first node N1' and may reduce a voltage difference between a first terminal and a second terminal of the third transistor T3'. In some exemplary embodiments, the seventh transistor T7' may include a gate receiving a bias voltage VBIAS, a first terminal connected to the first node N1', and a second terminal connected to the first terminal of the third transistor T3'. Here, the bias voltage VBIAS may be a DC voltage that is set to turn on the seventh transistor T7'.

The eighth transistor T8' may be connected between the first transistor T1' and a second node N2' and may reduce a current flowing through the first transistor T1' while the data voltage is applied to the second node N2'. In some exemplary embodiments, the eighth transistor T8' may include a gate connected to a second terminal of the first transistor T1', a first terminal connected to the second terminal of the first transistor T1', and a second terminal connected to the second node N2'.

Although FIG. 11 illustrates an example of the pixel PX-10 including the sixth through eighth transistors T6', T7' and T8', the circuit structure of the pixel PX-10 may not be limited thereto. In another exemplary embodiment, for example, the pixel may include one or two of the sixth through eighth transistors T6', T7' and T8'.

An operation of the pixel PX-10 may be substantially the same as an operation of the pixel PX-2 of FIG. 6A, and thus duplicated descriptions are omitted.

Figure 12:
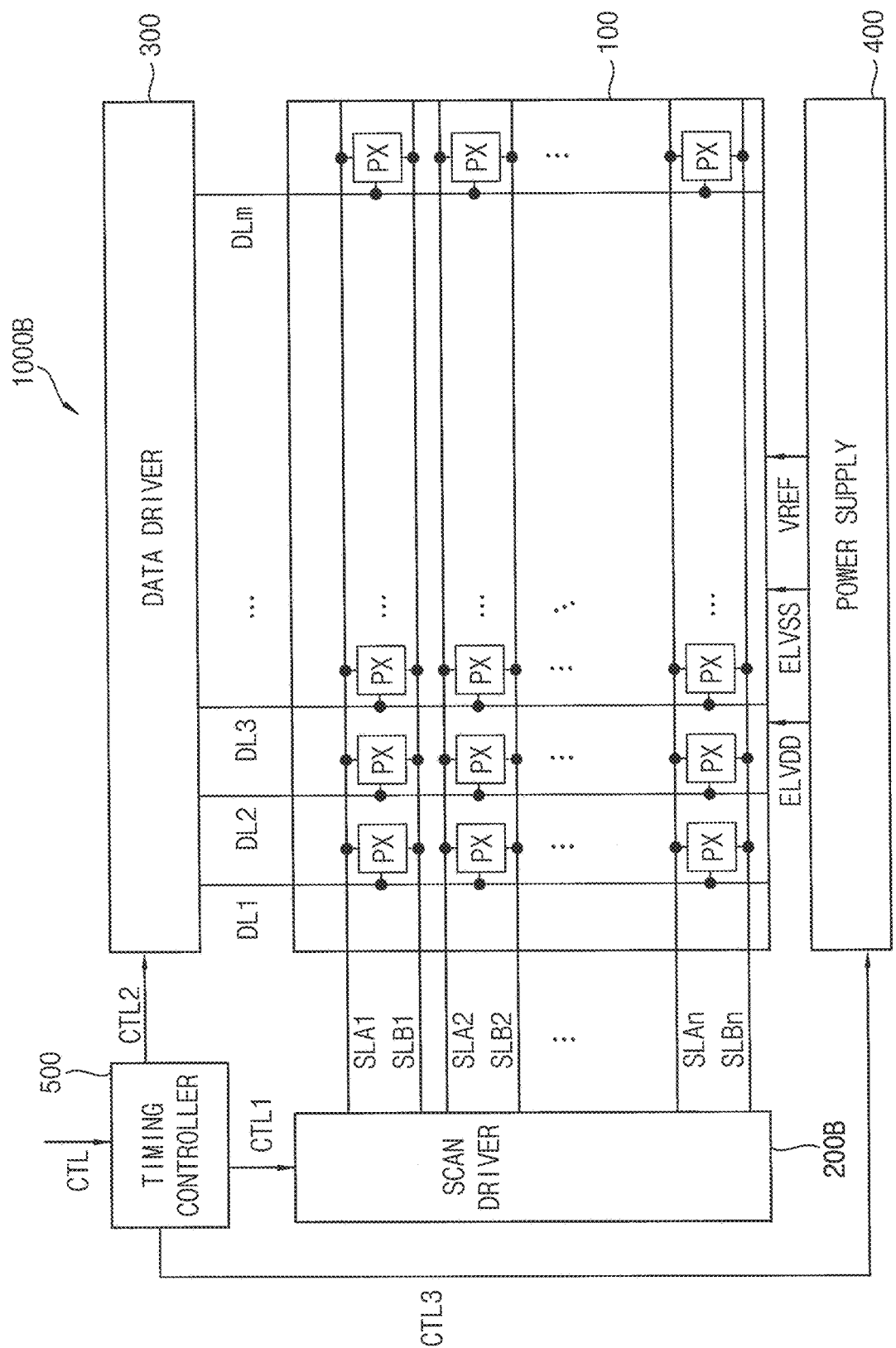
FIG. 12 is a block diagram illustrating another exemplary embodiment of a display device according to the invention.

FIG. 12 is a block diagram illustrating another exemplary embodiment of a display device according to the invention.

Referring to FIG. 12, a display device 1000B may include a display panel 100 having a plurality of pixels PX and a panel driver for driving the display panel 100. In some exemplary embodiments, the panel driver may include a scan driver 200B, a data driver 300, a power supply 400, and a timing controller 500. The display device 1000B may be substantially the same as the display device 1000A of FIG. 1, except that the scan driver 200B may provide the pixels PX with first and second scan signals having on-levels that partially overlap each other in their periods. The same or similar reference numerals are used to indicate the same or similar elements, and duplicated descriptions are omitted.

The display panel 100 may include the plurality of pixel PX to display an image. In an exemplary embodiment, for example, each pixel PX may receive a data voltage in response to a first scan signal and may perform a negative feedback compensation operation in response to a second scan signal. Accordingly, a voltage of an anode of a light emitting element may be maintained as the data voltage in each frame period.

The scan driver 200B may provide the first scan signal to the pixels PX via the first through n-th scan lines SLA1 through SLAn based on a first control signal CTL1. The scan driver 200B may further provide the second scan signal to the pixels PX via the first through n-th compensation control lines SLB1 through SLBn based on the first control signal CTL1.

The data driver 300 may convert digital image data into analog type data voltages and may provide the data voltages to the pixels PX via the data lines DL1 through DLm based on a second control signal CTL2.

The power supply 400 may provide a first power supply voltage ELVDD, a second power supply voltage ELVSS, and a reference voltage VREF to the pixels PX based on a third control signal CTL3.

The timing controller 500 may control the scan driver 200B, the data driver 300, and the power supply 400.

Figure 13:
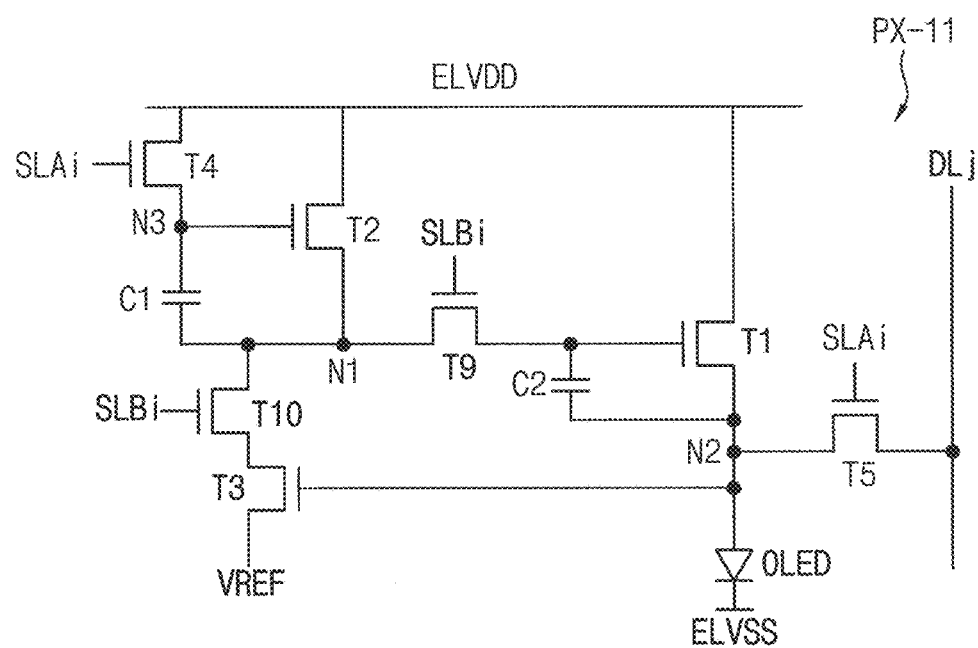
FIG. 13 is a circuit diagram illustrating an exemplary embodiment of a pixel included in the display device of FIG. 12.

FIG. 13 is a circuit diagram illustrating an exemplary embodiment of a pixel included in the display device of FIG. 12.

Referring to FIG. 13, a pixel PX-11 may include a first transistor T1, a second transistor T2, a third transistor T3, a fourth transistor T4, a fifth transistor T5, a ninth transistor T9, a tenth transistor T10, a first capacitor C1, a second capacitor C2 and a light emitting element OLED. The pixel PX-11 may be substantially the same as the pixel PX-1 of FIG. 2, except that the pixel PX-11 may further include the ninth transistor T9, the tenth transistor T10 and the second capacitor C2. The same or similar reference numerals are used to indicate the same or similar elements, and duplicated descriptions are omitted.

Compared with the pixel PX-1 of FIG. 2, the pixel PX-11 may further include the ninth and tenth transistors T9 and T10 to control a period in which a negative feedback compensation operation is performed, thereby reducing power consumption.

The ninth transistor T9 may be connected between a first node N1 and a gate of the first transistor T1 and may connect the first node N1 and the gate of the first transistor T1 in response to a second scan signal having an on-level. In some exemplary embodiments, the ninth transistor T9 may include a gate receiving the second scan signal transferred through an i-th compensation control line SLBi, a first terminal connected to the first node N1, and a second terminal connected to the gate of the first transistor T1. The voltage between the gate and the source of the first transistor T1 may be maintained based on the voltage stored in the second capacitor C2, and thus the light emitting element OLED may emit light based on the driving current corresponding to the data voltage, when the ninth transistor T9 is turned off by the second scan signal of an off-level.

The tenth transistor T10 may be connected between the first node N1 and a first terminal of the third transistor T3 and may connect the first node N1 and the first terminal of the third transistor T3 in response to the second scan signal having the on-level. In some exemplary embodiments, the tenth transistor T10 may include a gate receiving the second scan signal transferred through an i-th compensation control line SLBi, a first terminal connected to the first node N1, and a second terminal connected to the first terminal of the third transistor T3. Thus, the tenth transistor T10 may prevent the sampling current from flowing through the second and third transistors T2 and T3 to reduce the power consumption when the second scan signal has an off-level.

The second capacitor C2 may be connected between the gate of the first transistor T1 and a second terminal of the first transistor T1.

Thus, when the sampling current is blocked by the tenth transistor T10, the ninth transistor T9 and the second capacitor C2 may maintain a voltage of the gate of the first transistor T1.

In some exemplary embodiments, a reference voltage VREF applied to the third transistor T3 may be substantially the same as a second power supply voltage ELVSS. Thus, the pixel PX-11 may limitedly perform the negative feedback compensation operation, and thus may further reduce the power consumption compared with the pixel PX-1 of FIG. 2. In another exemplary embodiment, to eliminate an additional line for the reference voltage VREF, the second power supply voltage ELVSS may be used as the reference voltage VREF.

Figure 14:
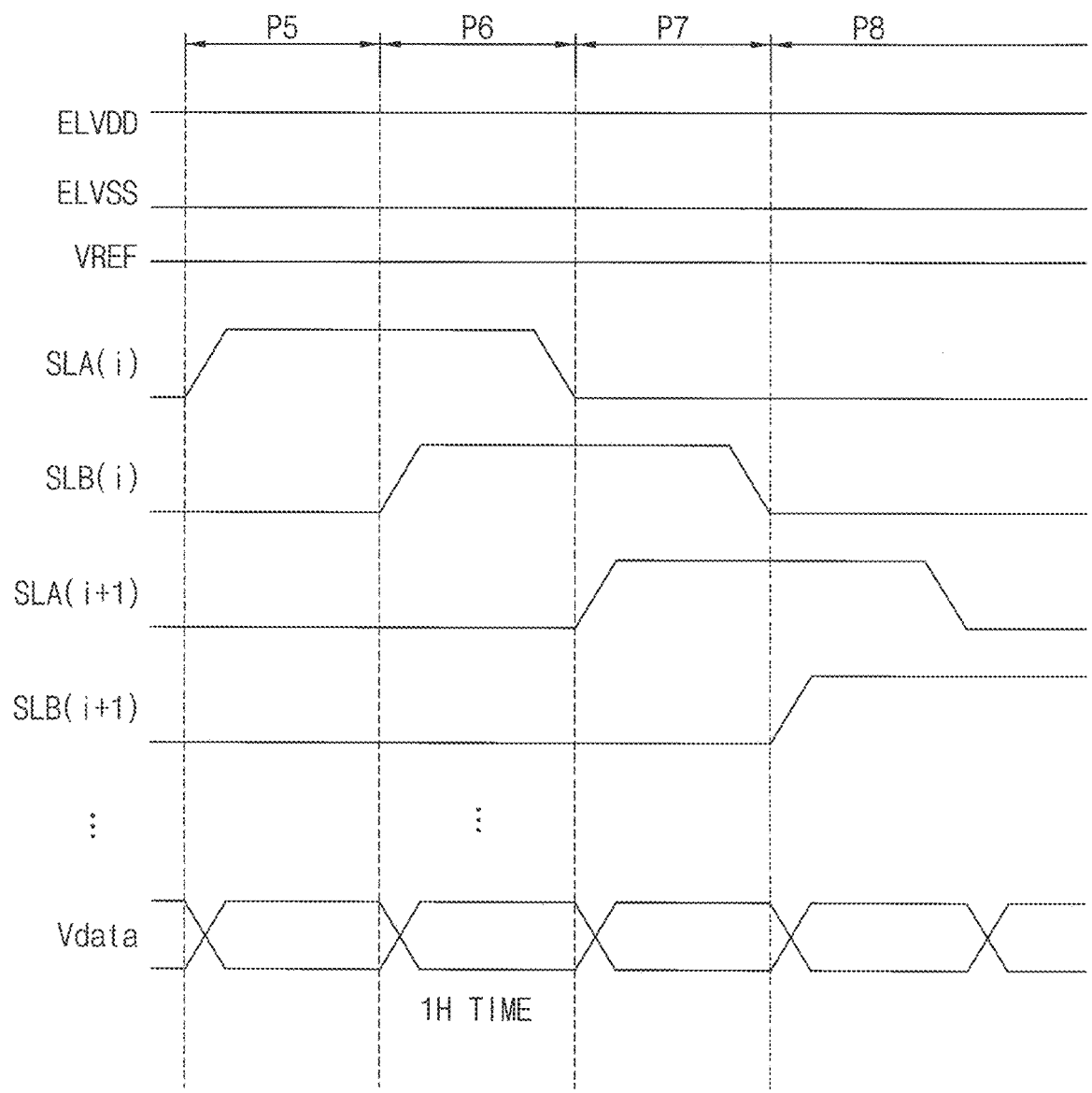
FIG. 14 is a timing diagram for describing an example of an operation of the pixel of FIG. 13.

FIG. 14 is a timing diagram for describing an example of an operation of the pixel of FIG. 13.

Referring to FIG. 14, a panel driver may drive a display panel in a progressive emission method where pixels sequentially emit light on a row-by-row basis. The panel driver may sequentially provide a first scan signal having an on-level to the scan lines SLA1 through SLAn. Further, the panel driver may sequentially provide a second scan signal having an on-level to the compensation control lines SLB1 through SLBn. Here, the first scan signal and the second scan signal applied to the same pixel and having an on-level may partially overlap each other in their periods (e.g., the sixth period P6). A first power supply voltage ELVDD, a second power supply voltage ELVSS and a reference voltage VREF may be maintained as constant.

A pixel PX-11 located at an i-th row and a j-th column of the pixels PX may receive a first scan signal SLA(i) having an on-level during a fifth period P5 and a sixth period P6 from an i-th scan line SLAi. Further, the pixel PX-11 may receive a second scan signal SLB(i) having an on-level during the sixth period P6 and a seventh period P7 from the i-th compensation control line SLBi.

In the sixth period P6, fourth and fifth transistors T4 and T5 of the pixel PX-11 may be turned on in response to the first scan signal SLA(i) having the on-level. The fifth transistor T5 may transfer the data voltage to a second node N2, and a voltage of the second node N2 may be set as the data voltage. The fourth transistor T4 may transfer the first power supply voltage ELVDD to a third node N3, and a voltage of the third node N3 may be set as the first power supply voltage ELVDD.

Further, in the sixth period P6, ninth and tenth transistors T9 and T10 of the pixel PX-11 may be turned on in response to the second scan signal SLB(i) having the on-level. A sampling current Isam corresponding to a difference (or Vdata-VREF) between a voltage (or Vdata) of a gate of a third transistor T3 and a voltage (or VREF) of a source of the third transistor T3 may flow through the third transistor T3 and the tenth transistor T10. The sampling current Isam may flow also through a second transistor T2 included in a current path of the sampling current Isam. That is, a difference between a voltage of a gate of the second transistor T2 and a voltage of a source of the second transistor T2 may be adjusted such that the sampling current Isam flows through the second transistor T2, and the adjusted voltage difference may be stored in a first capacitor C1.

In the seventh period P7, the pixel PX-11 may receive the first scan signal SLA(i) having an off-level. The fourth and fifth transistors T4 and T5 of the pixel PX-11 may be turned off in response to the first scan signal SLA(i) having the off-level. Based on the voltage stored in the first capacitor C1, the sampling current Isam may flow through the second transistor T2 as in the sixth period P6. Further, the sampling current Isam may flow also through the tenth transistor T10 and the third transistor T3. That is, the difference (or Vdata-VREF) between the voltage of the gate of the third transistor T3 and the voltage of the source of the third transistor T3 may be maintained such that the sampling current Isam flows through the third transistor T3 even in the seventh period P7. Thus, the pixel PX-11 may have a negative feedback loop structure including the first transistor T1, the second transistor T2 and the third transistor T3, and thus may maintain a voltage of a first terminal (or the second node N2) of a light emitting element OLED as a constant voltage level. Further, although the first scan signal SLA(i) is changed from the on-level to the off-level, the negative feedback compensation operation is performed in the seventh period P7, and thus the voltage of the second node N2 may not be affected by a kick-back phenomenon. Accordingly, in the seventh period P7, a driving current corresponding to the voltage (or the data voltage) of the first terminal of the light emitting element OLED may flow through the light emitting element OLED, and the light emitting element OLED may emit light based on the driving current.

In an eighth period P8, the pixel PX-11 may receive the second scan signal SLB(i) having the off-level. The ninth and tenth transistors T9 and T10 of the pixel PX-11 may be turned off in response to the second scan signal SLB(i) having the off-level. Accordingly, since the sampling current Isam does not flow through the second and third transistors T2 and T3, the negative feedback compensation operation may be stopped in the eighth period P8. However, the voltage between the gate and source of the first transistor T1 may be maintained based on the voltage stored in the second capacitor C2, and thus the light emitting element OLED may emit light based on the driving current corresponding to the data voltage.

Accordingly, the pixel PX-11 of FIG. 13 may prevent an unnecessary sampling current in the eighth period P8, thereby further reducing the power consumption compared with the pixel PX-1 of FIG. 2.

Although FIG. 14 illustrates an example where the pixels PX-11 are driven in a progressive emission method, a driving method may not be limited thereto. In an exemplary embodiment, for example, the pixels PX-11 may be driven in a simultaneous emission method as illustrated in FIG. 5.

Figure 15:
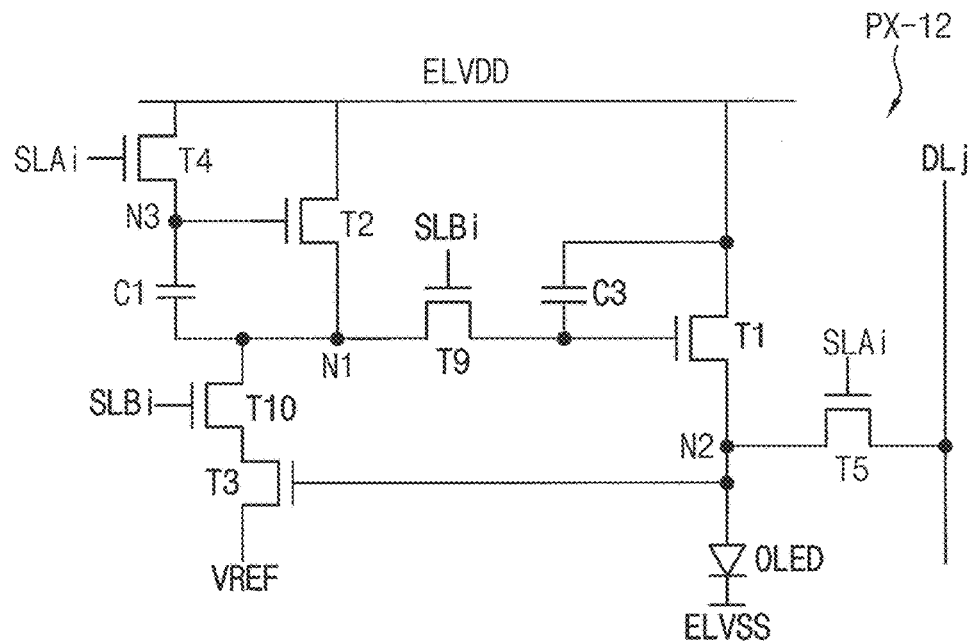
FIGS. 15 through 17 are circuit diagrams illustrating other exemplary embodiments of pixels included in the display device of FIG. 12.
Figure 16:
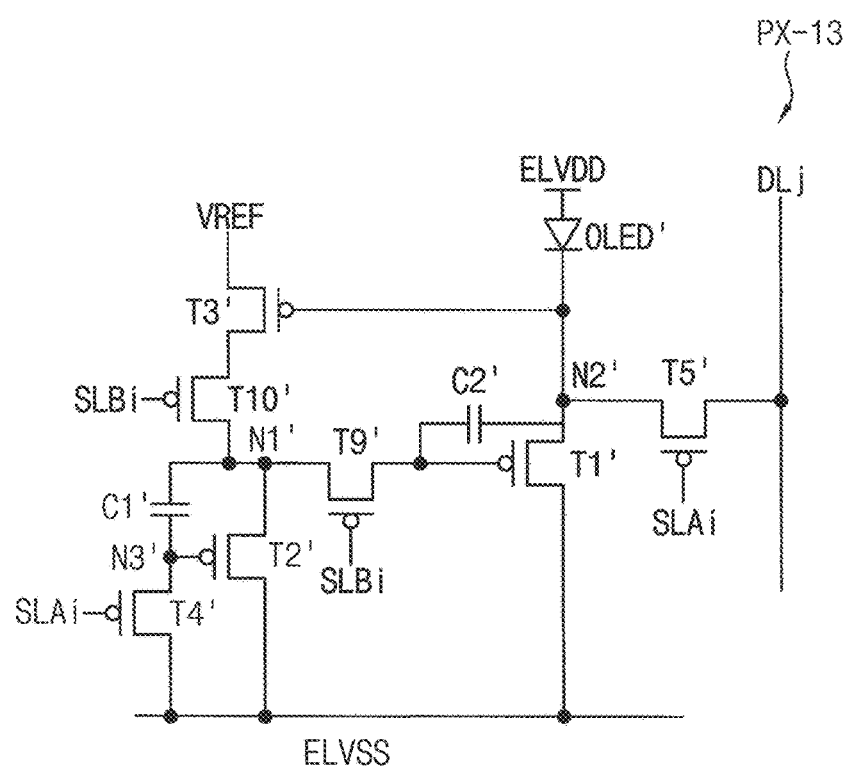
Figure 17:
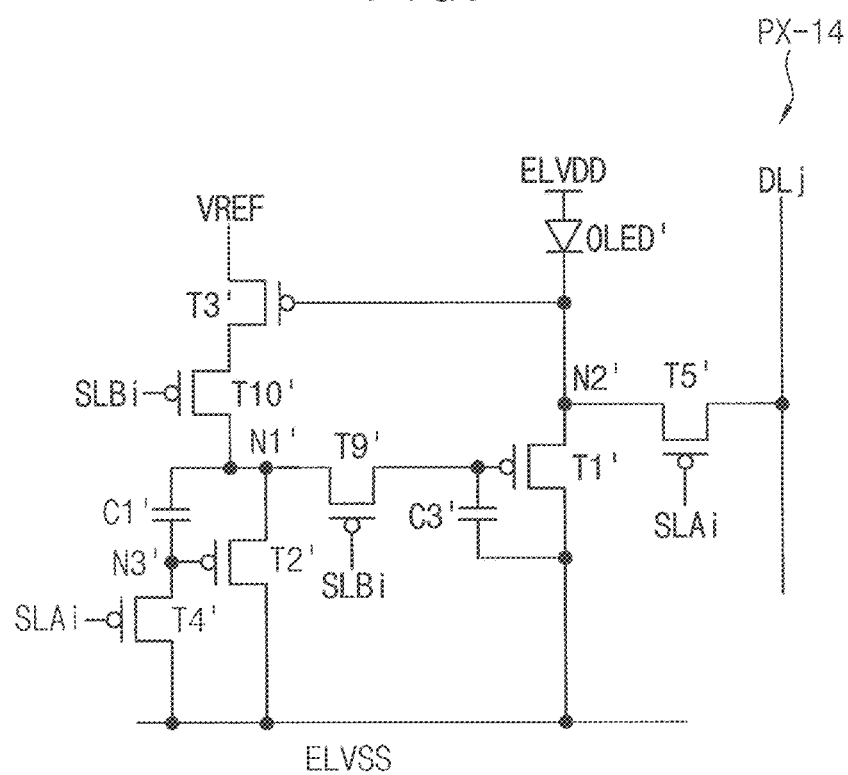

FIGS. 15 through 17 are circuit diagrams illustrating other exemplary embodiments of pixels included in the display device of FIG. 12.

Referring to FIG. 15, a pixel PX-12 may include a first transistor T1, a second transistor T2, a third transistor T3, a fourth transistor T4, a fifth transistor T5, a ninth transistor T9, a tenth transistor T10, a first capacitor C1, a third capacitor C3 and a light emitting element OLED. The pixel PX-12 may be substantially the same as the pixel PX-11 of FIG. 13, except that the pixel PX-12 may include the third capacitor C3 instead of a second capacitor C2. The same or similar reference numerals are used to indicate the same or similar elements, and duplicated descriptions are omitted.

Compared with the pixel PX-1 of FIG. 2, the pixel PX-12 may further include the ninth and tenth transistors T9 and T10 to control a period in which a negative feedback compensation operation is performed, thereby reducing power consumption.

The ninth transistor T9 may be connected between the first node N1 and the gate of the first transistor T1 and may connect the first node N1 and the gate of the first transistor T1 in response to the second scan signal having an on-level.

The tenth transistor T10 may be connected between the first node N1 and the first terminal of the third transistor T3 and may connect the first node N1 and the first terminal of the third transistor T3 in response to the second scan signal having the on-level.

The third capacitor C3 may be connected between the gate of the first transistor T1 and the first terminal of the first transistor T1. The third capacitor C3 may maintain a voltage of the gate of the first transistor T1, and thus the light emitting element OLED may emit light based on a driving current corresponding to the data voltage.

In the pixel PX-12 of FIG. 15, the third capacitor C3 may be provided using a layer of the gate of the first transistor T1 and a layer of a line of a first power supply voltage ELVDD, and thus the pixel PX-12 of FIG. 15 may be more readily implemented compared with the pixel PX-11 of FIG. 13 in terms of a layout. However, in the pixel PX-11 of FIG. 13, the second capacitor C2 may maintain the voltage between the gate and source of the first transistor, and thus the pixel PX-11 of FIG. 13 may stably maintain the voltage of the second node and may have high reliability compared with the pixel PX-12 of FIG. 15.

Although FIGS. 13 and 15 illustrate exemplary embodiments where NMOS transistors are used, the pixel may be implemented with PMOS transistors.

In some exemplary embodiments, a pixel PX-13 of FIG. 16 may include a first transistor T1', a second transistor T2', a third transistor T3', a fourth transistor T4', a fifth transistor T5', a ninth transistor T9', a tenth transistor T10', a first capacitor C1', a second capacitor C2' and a light emitting element OLED'. The transistors T1', T2', T3', T4', T5', T9' and T10' may be PMOS transistors. A structure of the pixel PX-13 may be substantially the same as that of the pixel PX-9 of FIG. 10, except that the pixel PX-13 further include the ninth transistor T9', the tenth transistor T10' and the second capacitor C2'. The same or similar reference numerals are used to indicate the same or similar elements, and duplicated descriptions are omitted. The ninth transistor T9' may be connected between the first node N1' and the gate of the first transistor T1' and may connect the first node N1' and the gate of the first transistor T1' in response to the second scan signal. The tenth transistor T10' may be connected between the first node N1' and the first terminal of the third transistor T3' and may connect the first node N1' and the first terminal of the third transistor T3' in response to the second scan signal. The second capacitor C2' may be connected between the gate of the first transistor T1' and the second terminal of the first transistor T1'.

In other exemplary embodiments, a pixel PX-14 of FIG. 17 may include a first transistor T1', a second transistor T2', a third transistor T3', a fourth transistor T4', a fifth transistor T5', a ninth transistor T9', a tenth transistor T10', a first capacitor C1', a third capacitor C3' and a light emitting element OLED'. The transistors T1', T2', T3', T4', T5', T9' and T10' may be PMOS transistors. A structure of the pixel PX-14 may be substantially the same as that of the pixel PX-13 of FIG. 16, except that the pixel PX-14 may include the third capacitor C3' instead of the second capacitor C2'. The same or similar reference numerals are used to indicate the same or similar elements, and duplicated descriptions are omitted. The third capacitor C3' may be connected between the gate of the first transistor T1' and the first terminal of the first transistor T1'. The third capacitor C3 may maintain a voltage of the gate of the first transistor T1'.

Although exemplary embodiments including the pixel include NMOS transistors or PMOS transistors are illustrated, the pixel may include various types of the transistors. In another exemplary embodiment, for example, the pixel may include CMOS transistors.

The inventive concepts may be applied to any electronic device including an organic light emitting display device. In an exemplary embodiment, for example, the inventive concepts may be applied to a television ("TV"), a digital TV, a 3D TV, a smart phone, a mobile phone, a tablet computer, a personal computer ("PC"), a home appliance, a laptop computer, a personal digital assistant ("PDA"), a portable multimedia player ("PMP"), a digital camera, a music player, a portable game console, a navigation device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the inventive concept. For example, although exemplary embodiments where the display device is an organic light emitting display device are described above, the type of the display device according to the invention may not be limited thereto.

Accordingly, all such modifications are intended to be included within the scope of the inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A pixel comprising:
a first transistor including a gate connected to a first node, a first terminal which receives a first power supply voltage, and a second terminal connected to a second node;
a second transistor including a gate connected to a third node, a first terminal which receives the first power supply voltage, and a second terminal connected to the first node;
a third transistor including a gate connected to the second node, a first terminal connected to the first node, and a second terminal which receives a reference voltage;
a fourth transistor including a gate which receives a first scan signal, a first terminal which receives the first power supply voltage, and a second terminal connected to the third node;
a fifth transistor including a gate which receives the first scan signal, a first terminal which receives a data voltage, and a second terminal connected to the second node;
a first capacitor connected between the first node and the third node; and
a light emitting element including a first terminal connected to the second node and a second terminal which receives a second power supply voltage.

2. The pixel of claim 1, wherein the first transistor, the second transistor and the third transistor operate in a saturation region.

3. The pixel of claim 1, wherein the reference voltage is lower than the first power supply voltage and higher than the second power supply voltage.

4. The pixel of claim 1, further comprising:
a sixth transistor including a gate connected to the third node, a first terminal which receives the first power supply voltage, and a second terminal connected to the first terminal of the second transistor.

5. The pixel of claim 1, further comprising:
a seventh transistor including a gate which receives a bias voltage, a first terminal connected to the first node, and a second terminal connected to the first terminal of the third transistor.

6. The pixel of claim 1, further comprising:
an eighth transistor including a gate connected to the second terminal of the first transistor, a first terminal connected to the second terminal of the first transistor, and a second terminal connected to the second node.

7. The pixel of claim 1, further comprising:
a ninth transistor including a gate which receives a second scan signal, a first terminal connected to the first node, and a second terminal connected to the gate of the first transistor; and
a tenth transistor including a gate which receives the second scan signal, a first terminal connected to the first node, and a second terminal connected to the first terminal of the third transistor.

8. The pixel of claim 7, further comprising:
a second capacitor connected between the gate of the first transistor and the second terminal of the first transistor.

9. The pixel of claim 7, further comprising:
a third capacitor connected between the gate of the first transistor and the first terminal of the first transistor.

10. The pixel of claim 7, wherein a period when the first scan signal has an on-level and a period when the second scan signal has an on-level partially overlap each other.

11. The pixel of claim 7, wherein the reference voltage is the same as the second power supply voltage.

12. The pixel of claim 1, wherein, when the first scan signal has an on-level, the second power supply voltage is higher than the data voltage.

13. A display device comprising:
a display panel including a plurality of pixels; and
a panel driver which drives the display panel,
wherein each of the pixels comprises:
a first transistor including a gate connected to a first node, a first terminal which receives a first power supply voltage, and a second terminal connected to a second node;
a second transistor including a gate connected to a third node, a first terminal which receives the first power supply voltage, and a second terminal connected to the first node;
a third transistor including a gate connected to the second node, a first terminal connected to the first node, and a second terminal which receives a reference voltage;
a fourth transistor including a gate which receives a first scan signal, a first terminal which receives the first power supply voltage, and a second terminal connected to the third node;
a fifth transistor including a gate which receives the first scan signal, a first terminal which receives a data voltage, and a second terminal connected to the second node;
a first capacitor connected between the first node and the third node; and
a light emitting element including a first terminal connected to the second node and a second terminal which receives a second power supply voltage.

14. The display device of claim 13, wherein a frame period for the display panel includes a programming period in which the data voltage is applied to and maintained in the pixels and an emission period in which the pixels simultaneously emit light, and
wherein the second power supply voltage has a first voltage level in the programming period and has a second voltage level lower than the first voltage level in the emission period.

15. The display device of claim 13, wherein the panel driver drives the display panel such that the pixels sequentially emit light on a row-by-row basis, and
wherein the second power supply voltage has a constant voltage level.

16. The display device of claim 15, wherein the reference voltage is lower than the first power supply voltage and higher than the second power supply voltage.

17. The display device of claim 13, wherein the first transistor, the second transistor and the third transistor operate in a saturation region.

18. The display device of claim 1, wherein each of the pixels further comprises:
a sixth transistor including a gate connected to the third node, a first terminal connected to the first power supply voltage, and a second terminal connected to the first terminal of the second transistor.

19. The display device of claim 13, wherein each of the pixels further comprises:
a seventh transistor including a gate which receives a bias voltage, a first terminal connected to the first node, and a second terminal connected to the first terminal of the third transistor.

20. The display device of claim 13, wherein each of the pixels further comprises:
an eighth transistor including a gate connected to the second terminal of the first transistor, a first terminal connected to the second terminal of the first transistor, and a second terminal connected to the second node.

21. The display device of claim 13, wherein each of the pixels further comprises:
a ninth transistor including a gate which receives a second scan signal, a first terminal connected to the first node, and a second terminal connected to the gate of the first transistor; and
a tenth transistor including a gate which receives the second scan signal, a first terminal connected to the first node, and a second terminal connected to the first terminal of the third transistor.

22. The pixel of claim 21, wherein each of the pixels further comprises:
a second capacitor connected between the gate of the first transistor and the second terminal of the first transistor.

23. The pixel of claim 21, wherein each of the pixels further comprises:
a third capacitor connected between the gate of the first transistor and the first terminal of the first transistor.

24. A pixel comprising:
a first transistor connected between a line supplying a power supply voltage and a second node, and which provides a driving current corresponding to a data voltage to a light emitting element based on a voltage of a first node;
a third transistor connected between the first node and a line supplying a reference voltage, and which generates a sampling current based on a difference between a voltage of the second node and the reference voltage;
a second transistor connected between the line supplying the power supply voltage and the first node, and which adjusts the voltage of the first node and generates the sampling current based on a voltage of a third node;
a fourth transistor which transfers the power supply voltage to the third node in response to a scan signal;
a fifth transistor which transfers the data voltage to the second node in response to the scan signal; and
a capacitor connected between the first node and the third node.

* * * * *